United States Patent [19]
Yamauchi et al.

[11] Patent Number: 5,742,550
[45] Date of Patent: Apr. 21, 1998

[54] SEMICONDUCTOR INTEGRATED CIRCUIT DEVICE

[75] Inventors: Tatsumi Yamauchi, Hitachiohta; Fumio Murabayashi, Ibaraki-ken, both of Japan

[73] Assignee: Hitachi, Ltd., Japan

[21] Appl. No.: 753,019

[22] Filed: Nov. 19, 1996

[30] Foreign Application Priority Data

Nov. 20, 1995 [JP] Japan .................................. 7-301536

[51] Int. Cl.$^6$ .................................................. G11C 7/00
[52] U.S. Cl. ............................... 365/203; 365/189.05
[58] Field of Search ........................... 365/203, 189.05

[56] References Cited

U.S. PATENT DOCUMENTS 5,313,434  5/1994  Abe .................................... 365/203
5,367,488  11/1994  An ..................................... 365/203
5,506,811  4/1996  McLaury ............................. 365/203

*Primary Examiner*—Son T. Dinh
*Attorney, Agent, or Firm*—Fay, Sharpe, Beall, Fagan, Minnich & McKee

[57] ABSTRACT

A semiconductor integrated circuit device using precharge circuits free from the influence of a phase difference skew is provided. Each of the precharge circuits is controlled by a clock signal such that an arbitrary node in the circuit is precharged during a low level period or a high level period of the clock signal and the precharge circuit is operative during a high level period or a low level period of the clock signal. A first precharge circuit and a second precharge circuit having the same operational functions are arranged in parallel, and controlled by their respective clock signals to perform complementary operations, wherein the second precharge circuit is in an active period when the first precharge circuit is in a precharge period, and the second precharge circuit is in a precharge period when the first precharge circuit is in an active period.

17 Claims, 13 Drawing Sheets

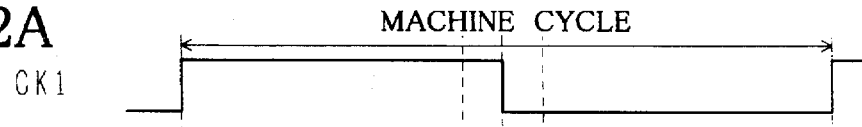
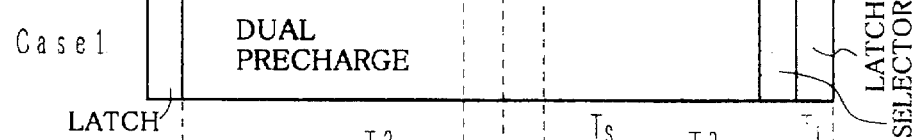
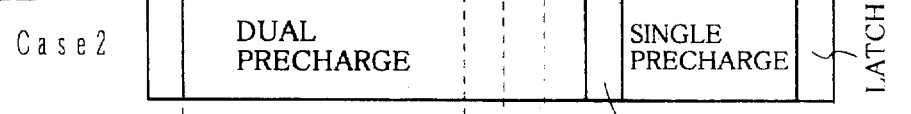
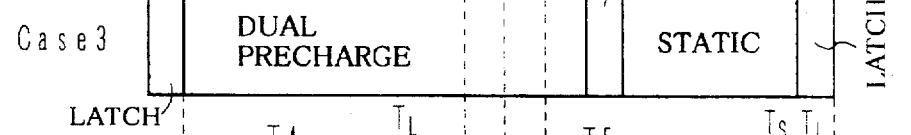
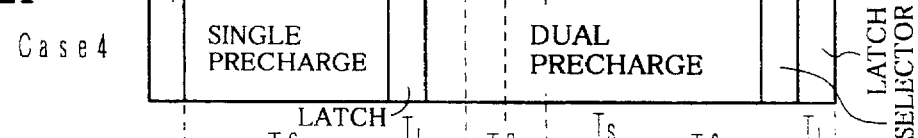
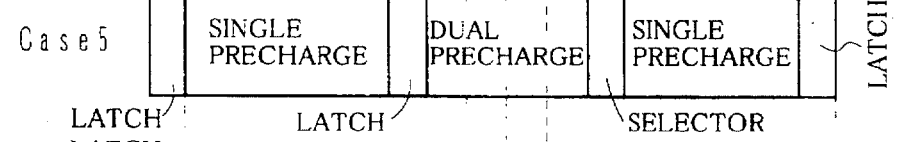
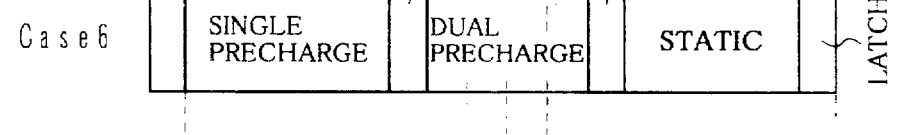

SEMICONDUCTOR INTEGRATED CIRCUIT DEVICE

BACKGROUND OF THE INVENTION

The present invention relates generally to semiconductor integrated circuit devices, and more particularly to semiconductor integrated circuit having precharge circuits suitable for use in high speed applications.

Conventional semiconductor integrated circuits generally use a precharge circuit for performing high speed operations. The precharge circuit is controlled, based on a clock signal, to alternately have a precharge period and an active period. A latch circuit is typically arranged previous to a precharge circuit for latching an input signal. Generally, a level trigger type latch circuit is used for that purpose, where a through period for passing an input signal therethrough and a hold period for holding an input signal are alternately controlled by a clock signal.

For example, a latch circuit is controlled to have a through period for passing an input signal therethrough when a clock signal $\phi1$ for controlling the latch circuit is at high level and to enter a hold period for holding data latched therein at the time the clock signal $\phi1$ changes to a low level. Also, a precharge circuit is controlled, for example, to have a precharge period when a clock signal $\phi2$ for controlling the precharge circuit is at low level and to have an active period for operating in response to an input signal supplied thereto at the time the clock signal $\phi2$ changes to a high level.

The clock signal $\phi1$ and the clock signal $\phi2$ have the same period and opposite phases to each other such that the latch circuit and the precharge circuit operate in synchronism. In other words, the latch circuit is in a through period when the clock signal $\phi1$ is at high level, while the precharge circuit is in a precharge period since the clock signal $\phi2$ is in opposite phase, i.e., at low level. When the clock signal $\phi1$ changes to low level to cause the latch circuit to enter a hold period to hold an input signal, the clock signal $\phi2$ is in opposite phase, i.e., at high level, causing the precharge circuit to enter an active period, in which the precharge circuit operates based on the signal held in the latch circuit.

Since the clock signal $\phi1$ used to control the latch circuit and the clock signal $\phi2$ used to control the precharge circuit have the same period and opposite phases to each other, these circuits suffer from a dead time due to a phase difference skew. How a phase difference skew occurs is explained below in detail.

The clock signal $\phi1$ and the clock signal $\phi2$ should have the same period and opposite phases to each other, so that, essentially, when the clock signal $\phi1$ changes from high level to low level, the clock signal $\phi2$ must change from low level to high level at the same timing. Conversely, when the clock signal $\phi1$ changes from low level to high level, the clock signal $\phi2$ must change from high level to low level at the same timing. However, since the clock signal $\phi1$ and the clock signal $\phi2$ are different clock signals, they are typically generated and distributed by different circuits. Therefore, variations in the processes and devices used for generating these clocks may cause a deviation in timing between a rising edge of the clock signal $\phi1$ and a falling edge of the clock signal $\phi2$, i.e., a phase difference skew.

When a rising edge of the clock signal $\phi2$ is delayed from the timing of a falling edge of the clock signal $\phi1$ to arise a phase difference skew, the operation of the precharge circuit is delayed due to the delayed rising edge of the clock signal $\phi2$, although the latch circuit has performed a latch operation in response to the falling edge of the clock signal $\phi1$, thus arising a dead time corresponding to the delay of the clock signal $\phi2$.

Conversely, when the clock signal $\phi2$ goes high earlier than a falling edge of the clock signal $\phi1$ to arise a phase difference skew, the clock signal $\phi2$ goes high even during a through period of the latch circuit, in which the latch circuit is not yet performing a latch operation, to cause the precharge circuit to operate in response to the rising clock signal $\phi2$. Thus, the precharge circuit cannot perform a correct operation, and a dead time arises corresponding to the time by which the clock signal $\phi2$ has risen earlier than the falling edge of the clock signal $\phi1$.

Further, since the phase difference skew possibly occurs when the clock signal $\phi2$ goes high at the timing of a falling edge of the clock signal $\phi1$ and when the clock signal $\phi1$ goes high at the timing of a falling edge of the clock signal $\phi2$, the phase difference skew can occur twice in one cycle of the clock signal $\phi1$, thus resulting in a longer dead time.

With the ever increasing miniaturization of semiconductor integrated circuits, discrete circuits can operate at higher speeds. However, as a total load capacity and a total wiring length associated with clock signals are increased due to higher integration of semiconductor integrated circuits, it is more difficult to reduce the clock skew, particularly, the phase difference skew as compared with discrete circuits.

When a precharge circuit is employed, for example, in each of a plurality of logical circuits which are connected in series for performing high speed logical operations within one machine cycle, the logical operations must be performed so as to avoid a dead time due to the above-mentioned phase difference skew, and a latch circuit must be operated to store data indicating the results of the logical operations before the next dead time occurs. For these requirements, the number of stages of the serially connected logical circuits must be reduced to perform a less number of logical operations within one machine cycle. Thus, although the precharge circuit is employed for the purpose of high speed operations, the high speed operations are limited by the influence of the dead time due to the phase difference skew.

SUMMARY OF THE INVENTION

It is therefore an object of the present invention to provide a semiconductor integrated circuit device using a precharge circuit which is free from the influence of the phase difference skew.

To achieve the above object, the present invention provides a semiconductor integrated circuit device having a precharge circuit controlled by clock signals, wherein an arbitrary node of the precharge circuit is precharged therein during a low level period or a high level period of an associated one of the clock signals and the precharge circuit is active during a high level period or a low level period of the associated clock signal. The semiconductor integrated circuit device comprising a first precharge circuit and a second precharge circuit having the same operational functions and arranged in parallel, wherein the first precharge circuit and the second precharge circuit are controlled such that the first precharge circuit and the second precharge circuit perform complementary operations, wherein the second precharge circuit is in an active period when the first precharge circuit is in a precharge period, and the second precharge circuit is in a precharge period when the first precharge circuit is in an active period. With this configuration, it is possible to provide a semiconductor integrated circuit device which is free from the influence of a phase difference skew.

Also, to achieve the above object, the present invention provides a semiconductor integrated circuit device, free from the influence of a phase difference skew, which comprises first precharge means controlled by a first clock signal to precharge a predetermined node therein during a low level period or a high level period of the first clock signal and to operate on an input signal during a high level period or a low level period of the first clock signal, and second precharge means, arranged in parallel with the first precharge means, the second precharge means controlled by an inverted clock signal generated by inverting the first clock signal and having the same operational functions as the first precharge means.

Further, to achieve the above object, the present invention provides a semiconductor integrated circuit device, free from the influence of a phase difference skew, which comprises first latch means controlled by a first clock signal having a predetermined period for latching an input signal, first precharge means controlled by a second clock signal having a period twice the period of the first clock signal, the first precharge means being precharged during one half of the period of the second clock signal and operative based on the signal latched by the latch means during the remaining half period of the second clock signal, second precharge means controlled by a third clock signal generated by inverting the second clock signal and arranged in parallel with the first precharge means, the second precharge means being precharged during one half of the period of the third clock signal and operative based on a signal latched by the first latch means, selector means controlled by the second clock signal for alternately selecting output signals of the first and second precharge means, and second latch means controlled by the first clock signal for latching an output signal of the selector means.

BRIEF DESCRIPTION OF THE DRAWINGS

FIGS. 12A–12H are diagrams for explaining the concept of how operation times are allocated to components in the respective embodiments of the present invention; and FIG. 13 is a block diagram illustrating another embodiment of a semiconductor integrated circuit device according to the present invention when applied to a logical circuit in a microprocessor or the like.

DESCRIPTION OF THE PREFERRED EMBODIMENTS

The present invention will hereinafter be described in connection with various embodiments thereof with reference to the accompanying drawings.

Figure 1:
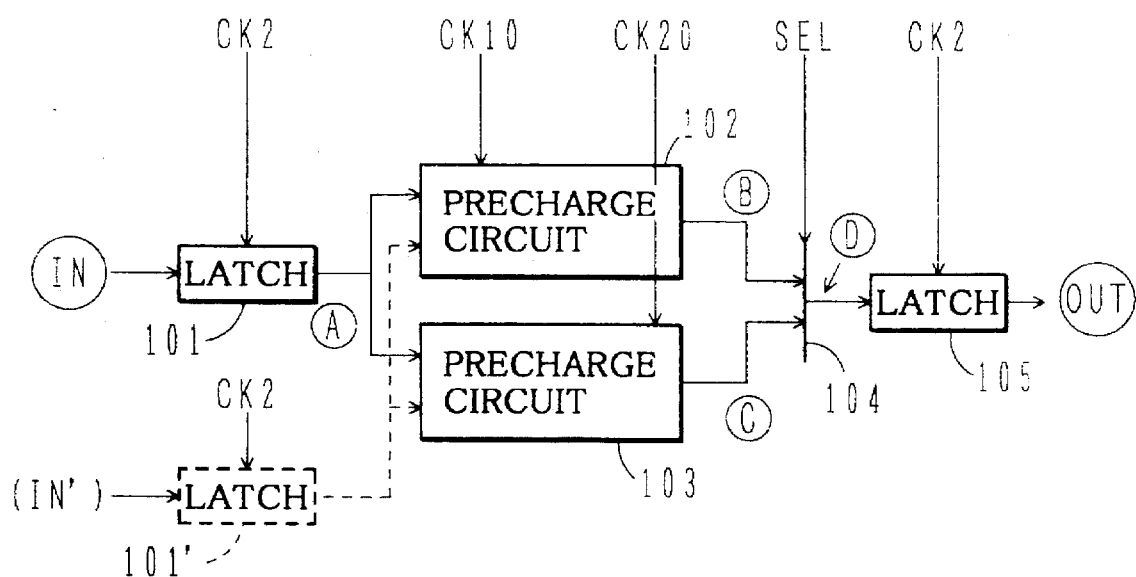
FIG. 1 is a block diagram illustrating a semiconductor integrated circuit device according to a first embodiment of the present invention.

Referring first to FIGS. 1 and 2A–2I, a first embodiment of the present invention will be described. FIG. 1 is a block diagram illustrating a semiconductor integrated circuit device according to the first embodiment of the present invention, and FIGS. 2A–2I are timing charts for explaining the operation of the semiconductor integrated circuit device according to the first embodiment of the present invention illustrated in FIG. 1.

Referring specifically to FIG. 1, a latch circuit 101 is controlled by a clock signal CK2 to be in a through period for passing input data IN therethrough when the clock signal CK2 is at high level and in a hold period for holding therein the input data IN when the clock signal CK2 is at low level.

An output of the latch circuit 101 is inputted to a precharge circuit 102 and to a precharge circuit 103, respectively. A precharge circuit has an internal node thereof set at a fixed potential during a precharge period and operates in an active period subsequent to the precharge period to propagate a signal therethrough. Detailed description of exemplary precharge circuits will be given later with reference to FIGS. 3, 4. The precharge circuit may be implemented by circuits which exclusively perform propagation of a signal, such as a shift register, or by logical circuits for performing logical operations such as a NAND circuit and a NOR circuit. Further, the precharge circuit typically comprises a serially connected circuit units at a plurality of stages.

The precharge circuit 102 is controlled by a clock signal CK10 to be in a precharge period for precharging an internal node thereof when the clock signal CK10 is at low level and to operate in response to an output signal of the latch circuit 101 when the clock signal CK10 changes to high level. The clock signal CK10 employed herein has a period twice the period of the clock signal CK2, and the clock signal CK10 changes from low level to high level or from high level to low level, for example, at the timing of a falling edge of the clock signal CK2.

The precharge circuit 103, in turn, is controlled by a clock signal CK20 to be in a precharge period for precharging an internal node thereof when the clock signal CK20 is at low level and to operate in response to an output signal of the latch circuit 101 when the clock signal CK20 changes to high level. The clock signal CK20 employed herein has a period twice the period of the clock signal CK2, and the clock signal CK20 changes from high level to low level or from low level to high level, for example, at the timing of a falling edge of the clock signal CK2. In other words, the clock signal CK20 is an inverted version of the clock signal CK10, i.e., the clock signal CK20 has the same period as and the opposite phase to the clock signal CK10.

Thus, when the clock signal CK10 is at low level, the precharge circuit 102 is in a precharge period, and at this time, the clock signal CK20 is at high level so that the precharge circuit 103 is in an active period. Conversely, when the clock signal CK10 is at high level, the precharge circuit 102 is in an active period, and at this time, the clock signal CK20 is at low level so that the precharge circuit 103 is in a precharge period. In other words, the precharge circuit 102 and the precharge circuit 103 are controlled to perform complementary operations.

In addition, the precharge circuit 102 and the precharge circuit 103 are each composed of circuits having the same functions which generate the same output for the same input. Thus, the precharge circuit 102 and the precharge circuit 103 are designed to perform complementary operations also from the fact that the two circuits having the same functions alternately operate.

While only one of the precharge circuits 102, 103 can merely output result data once per two cycles of the clock signal CK2, a combination of them can virtually output result data in every cycle of the clock signal CK2 since the precharge circuit 102 and the precharge circuit 103 alternately operate every other cycle. It should be noted that the precharge circuit 102 and the precharge circuit 103 may be different in circuit configuration as long as they have the same input/output relationship.

Outputs of the precharge circuit 102 and the precharge circuit 103 are inputted to a selector 104. The selector 104 is controlled by a selection signal SEL to alternately select the output of the precharge circuit 102 and the output of the precharge circuit 103. As the selection signal SEL, a signal synchronized with the clock signal CK10 or the clock signal CK20 may be used. More specifically, the clock signal CK10 or the clock signal CK20 may be used.

An output signal of the precharge circuit 102 or the precharge circuit 103 selected by the selector 104 is inputted to a latch circuit 105. The latch circuit 105 is controlled by the clock signal CK2 to be in a through period for passing therethrough a signal from the precharge circuit 102 or 103 when the clock signal CK2 is at high level and in a hold period for holding therein a signal from the precharge circuit 102 or 103 when the clock signal CK2 is at low level. In this way, the latch circuit 105 delivers an output OUT.

While the precharge circuits 102, 103 have been described to be supplied with one kind of input data IN, each of the precharge circuits 102, 103 may be composed of logical circuits to perform a logical operation on two inputs thereof. In this case, a latch circuit 101' may be additionally provided for holding input data IN', as indicated by broken lines in FIG. 1, and controlled by the clock signal CK2 to supply the input data held therein to the respective precharge circuits 102, 103.

Next, the operation of the device illustrated in FIG. 1 will be explained with reference to timing charts of FIGS. 2A–2I.

Figure 2:
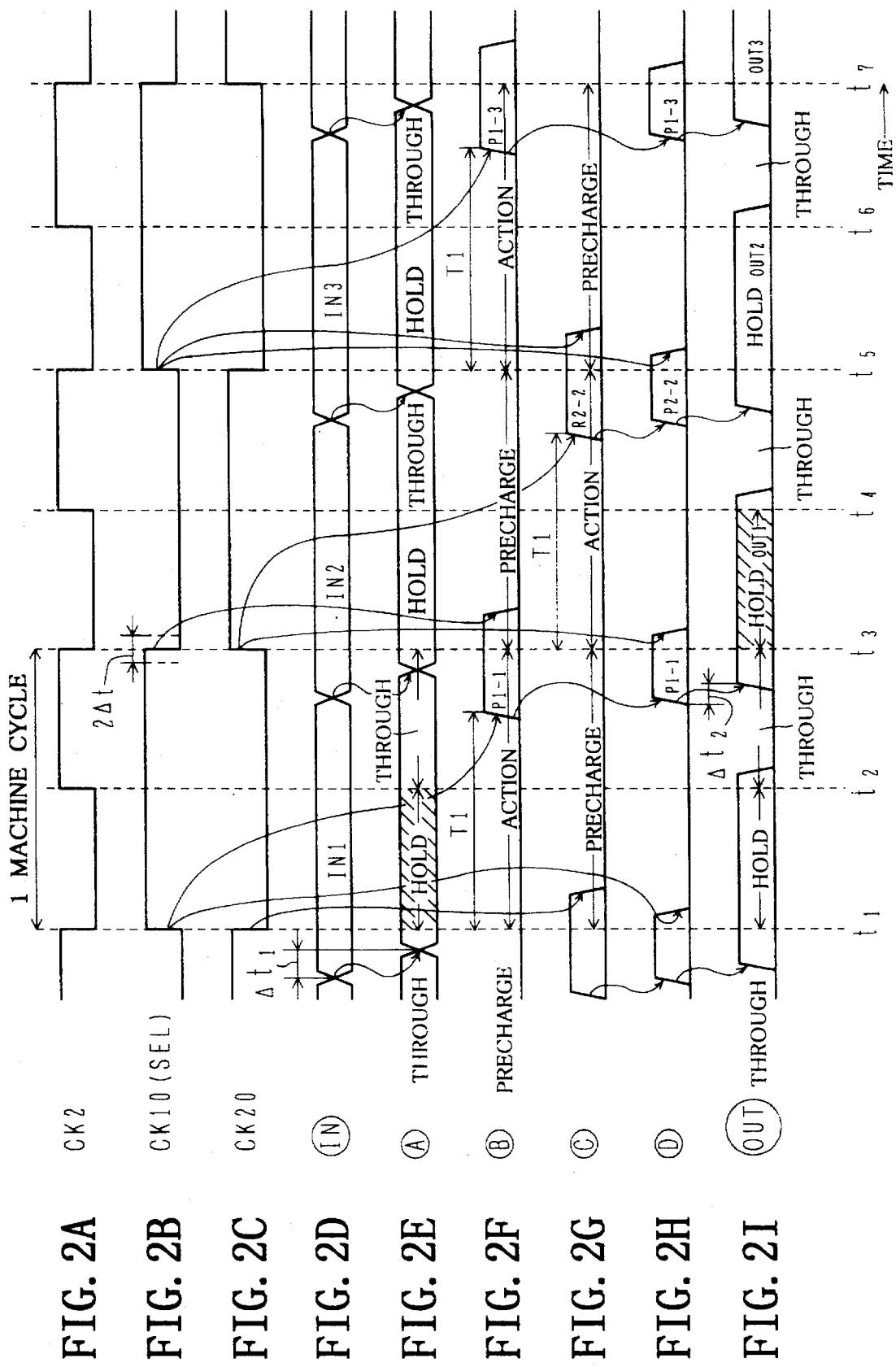
FIGS. 2A–2I are timing charts for explaining the operation of the semiconductor integrated circuit device illustrated in FIG. 1.

FIG. 2A illustrates a waveform chart of the clock signal CK2 for controlling the latch circuit 101 and the latch circuit 105. FIG. 2B illustrates a waveform chart of the clock signal CK10 for controlling the precharge circuit 102, which is also a waveform chart of the selection signal SEL for controlling the selector 104. FIG. 2C illustrates a waveform chart of the clock signal CK20 for controlling the precharge circuit 103. FIG. 2D represents input data IN supplied to the latch circuit 101. FIG. 2E represents output data of the latch circuit 101 at a point A in FIG. 1 and the operation of the latch circuit 101. FIG. 2F represents output data of the precharge circuit 102 at a point B in FIG. 1 and the operation of the precharge circuit 102. FIG. 2G represents output data of the precharge circuit 103 at a point C in FIG. 1 and the operation of the precharge circuit 103. FIG. 2H represents output data of the selector 104 at a point D in FIG. 1 and the operation of the selector 104. FIG. 2I represents output data OUT of the latch circuit 105 and the operation of the latch circuit 105.

As illustrated in FIGS. 2A and 2B, the clock signal CK10 has a period twice the period of the clock signal CK2 and changes from low level to high level or from high level to low level at the timing of a falling edge of the clock signal CK2. Also, as illustrated in FIG. 2C, the clock signal CK20 has a period twice the period of the clock signal CK2, and changes from high level to low level or from low level to high level, for example, at the timing of a falling edge of the clock signal CK2.

Here, one cycle of the clock signal CK2 is defined to be one machine cycle of the semiconductor integrated circuit device of this embodiment.

Assume that input data IN1, IN2, IN3 in one machine cycle are sequentially inputted to the latch circuit 101, as illustrated in FIG. 2D.

The latch circuit 101 is controlled to be in a through period, for passing therethrough the input data IN, when the clock signal CK2 is at high level and in a hold period, for holding the input data IN therein, when the clock signal CK2 is at low level. Thus, as illustrated in FIG. 2E, a hold period appears from a time t1 to a time t2, followed by a through period from the time t2 to a time t3, and subsequently, the hold period and the through period alternate in synchronism with the clock signal CK2. Also, as illustrated in FIGS. 2E, the input data IN1 supplied to the latch circuit 101 appears at the output of the latch circuit 101 with a time delay $\Delta t1$ caused by the propagation of the input signal IN1 through the latch circuit 101. Since the latch circuit 101 is in the hold period from the time t1 to the time t2, the input data IN1 is held at the output of the latch circuit 101.

The precharge circuit 102 is controlled to be in a precharge period when the clock signal CK10 is at low level and to enter an active period for operating in response to output data of the latch circuit 101 when the clock signal CK10 changes to high level. Thus, as illustrated in FIG. 2F, an active period appears from the time t1 to the time t3, followed by a precharge period from the time t3 to a time t5, and subsequently, the active period and the precharge period alternate in synchronism with the clock signal CK10. At the time t1 at which the clock signal CK10 goes high, the precharge circuit 102 enters the active period and starts operating based on the input data IN1 held in the latch circuit 101 at this time. Assuming that the precharge circuit 102 takes a time period T1 for its operation, data P1-1 indicating the result of the operation of the precharge circuit 102 appears at the output of the precharge circuit 102 after the time period T1 from the time t1, as illustrated in FIG. 2F. Also, after the time period T1 from the time t5, data P1-3 indicting the result of the operation performed by the precharge circuit 102 on the input data IN3 appears at the output of the precharge circuit 102.

The precharge circuit 103, in turn, is controlled to be in a precharge period when the clock signal CK20 is at low level and to enter an active period for operating in response to output data of the latch circuit 101 when the clock signal CK20 changes to high level. Thus, as illustrated in FIG. 2G, a precharge period appears from the time t1 to the time t3, followed by an active period from the time t3 to the time t5, and subsequently, the active period and the precharge period alternate in synchronism with the clock signal CK20. At the time t3 at which the clock signal CK20 goes high, the precharge circuit 103 enters the precharge period and starts operating based on the input data IN2 held in the latch circuit 101 at this time. Assuming that the precharge circuit 103 takes a time period T1 for its operation, data P2-2 indicating the result of the operation of the precharge circuit 103 appears at the output of the precharge circuit 103 after the time period T1 from the time t3, as illustrated in FIG. 2G.

The selector 104 alternately selects the output of the precharge circuit 102 and the output of the precharge circuit 103 in response to the selection signal SEL. As the selection signal SEL, the clock signal CK10 is used, so that the selector 104 selects the outputs P1-1, P1-3 of the precharge circuit 102 when the clock signal CK10 is at high level, and selects the output P2-2 of the precharge circuit 103 when the clock signal CK10 is at low level, as illustrated in FIG. 2H.

The latch circuit 105 is controlled to be in a through period for passing input data therethrough when the clock signal CK2 is at high level and in a hold period for holding input data therein when the clock signal CK2 is at low level. Thus, as illustrated in FIG. 2I, a hold period appears from the time t1 to the time t2, followed by a through period from the time t2 to the time t3, and subsequently, the hold period and the through period alternate in synchronism with the clock signal CK2. Also, as illustrated in FIG. 2H, input data supplied to the latch circuit 105 appears at the output of the latch circuit 105 with a time delay Δt2 caused by the propagation of the input data through the latch circuit 105. Since the latch circuit 105 is in a hold period from the time t3 to a time t4, the latch circuit 105 holds the output data P1-1 of the precharge circuit 102, supplied thereto as input data, at its output as output data OUT1. Similarly, since the latch circuit 105 is in a hold period from the time t5 to a time t6, the latch circuit 105 holds the output data P2-2 of the precharge circuit 103, supplied thereto as input data, at its output as output data OUT2. Also similarly, since the latch circuit 105 is in a hold period from a time t7, the latch circuit 105 holds the output data P1-3 of the precharge circuit 102, supplied thereto as input data, at its output as output data OUT3.

In other words, as illustrated in FIG. 2I, the latch circuit 105 delivers outputs resulting from the operation of the precharge circuit 102 or the precharge circuit 103 performed on the input data IN1, IN2, IN3 supplied to the latch circuit 101, as the output data OUT1, OUT2, OUT3 every machine cycle.

Although the clock signals CK10, CK20, for controlling the precharge circuits 102, 103, respectively, have a period twice the period of the reference clock CK2, the precharge circuits 102, 103 are operated complementarily so that an output can be provided every machine cycle as if they were operated as a single precharge circuit. In addition, since the precharge circuits 102, 103 are complementarily operated using the clock signals CK10, CK20 having a period twice the period of the reference clock signal CK2, they can be operated without suffering from the influence of the phase difference skew. It should be noted that an in-phase skew does occur even in this case, however, the in-phase skew is one fifth or less as compared with the phase difference skew, and therefore hardly influences the operations of the precharge circuits 102, 103.

Here, explanation will be given of the reason why the problem of the phase difference skew is avoided by the foregoing configuration. Comparing the clock signal CK2 with the clock signal CK10, if a rising edge of the clock signal CK10 at the time t1, for example, is generated in synchronism with a falling edge of the clock signal CK2, no deviation in timing will occur between the two clock signals CK2 and CK10. Also, if a falling edge of the clock signal CK10 at the time t3 is generated in synchronism with a falling edge of the clock signal CK2, no deviation in timing will occur between the two clock signals CK2 and CK10. Of course, since a clock distribution system from a clock generator for generating the clock signal CK2 to the latch circuit 101 is different from a clock distribution system from the clock generator for generating the clock signal CK10 to the precharge circuit 102, the different distribution systems may possibly cause a skew as indicated by a broken line at the time t3 in FIG. 2B. However, the skew possibly generated in this case is an in-phase skew and its magnitude is generally smaller than that of the phase difference skew. In other words, the in-phase skew due to variations in devices used in the clock distribution systems and the design of the clock distribution systems (i.e., a wiring capacity, a wiring resistance, the number of fan-outs) can be reduced to a relatively small magnitude by employing identical components as much as possible to the respective clock distribution systems. On the other hand, since the phase difference skew occurs between different clock signals supplied by different clock distribution systems, the phase difference skew is more likely to be affected by the processes of clock distribution systems and variations in used devices. For this reason, the phase difference skew has a magnitude larger than that of the in-phase skew.

As mentioned above, one machine cycle is defined to be one cycle of the clock signal CK2 from the time t1 to the time t3. Conventionally, a phase difference skew has been typically generated in the middle of one machine cycle, i.e., at the time t2. However, since the clock signal CK10 having a period twice the period of the clock signal CK2 is employed in this embodiment, a skew at the time t2 is avoided. Therefore, since the whole time period from the time t1 to the time t3 except for a very short portion of dead time caused by small in-phase skews occurring at the time t1 and the time t3 can be allocated to the operation of the precharge circuits, it is possible to provide a larger number of stages of logical circuits and higher speed operations.

It will be appreciated from the foregoing description that the semiconductor integrated circuit device using precharge circuits, according to the first embodiment, is free from the influence of phase difference skew, and that the precharge circuits, capable of performing high speed operations, can be operated at high speed without any dead time due to a phase difference skew between clock signals.

Figure 3:
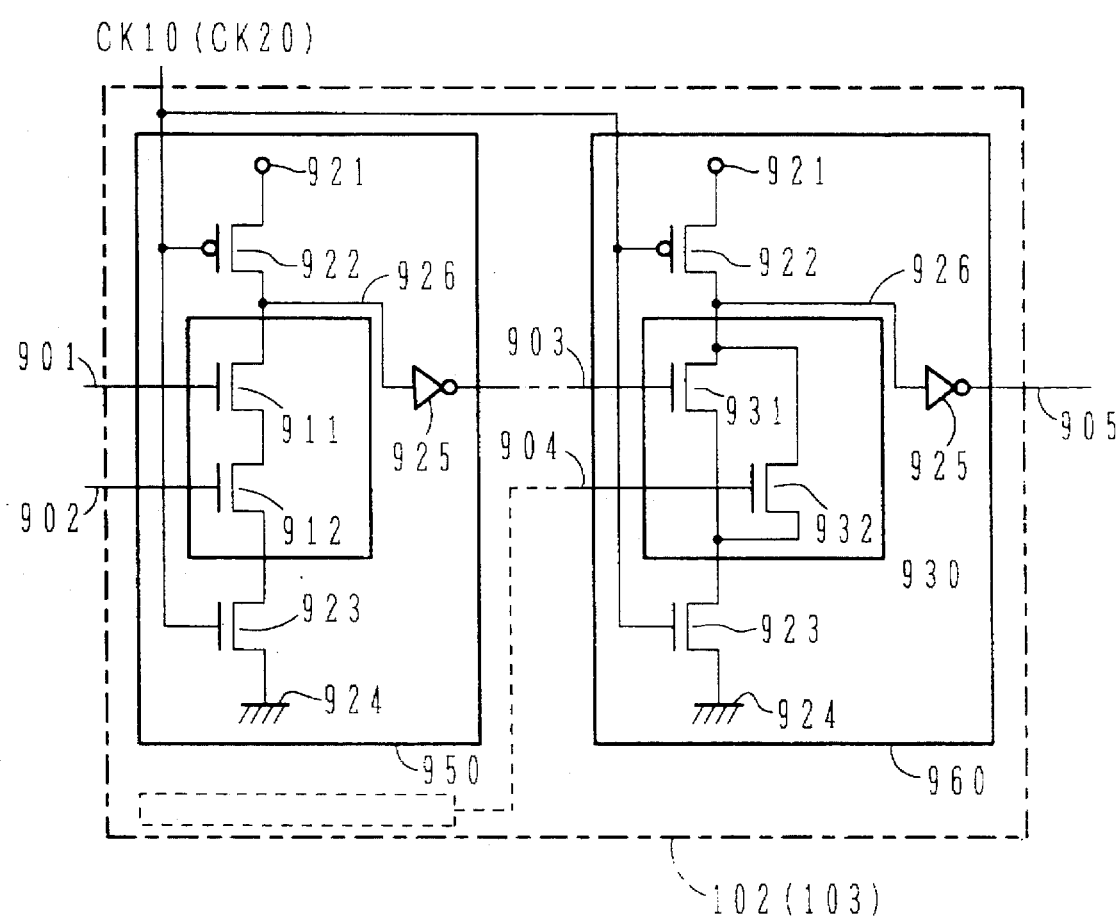
FIG. 3 is a circuit diagram illustrating a first precharge circuit used in the semiconductor integrated circuit device according to the first embodiment of the present invention.

Next, a first implementation of the precharge circuit will be described with reference to FIG. 3. FIG. 3 illustrates a circuit diagram of the first implementation of the precharge circuit which may be employed in the semiconductor integrated circuit device according to the first embodiment of the present invention.

The precharge circuit 102 and the precharge circuit 103 illustrated in FIG. 1 have the same function since they provide the same output from an input. Therefore, the following description is made on the assumption that the precharge circuits 102, 103 have the same circuit configuration.

The precharge circuit 102 (103) is composed of a plurality of precharge circuit units 950, ... , 960. The precharge circuit units 950, ... , 960 are controlled by the same clock signal CK10 (CK20) to alternate a precharge period and an active period.

The precharge circuit unit 950 comprises a two-input NAND circuit, while the precharge circuit unit 960 comprises a two-input NOR circuit. Between the precharge circuit unit 950 and the precharge circuit unit 960, approximately ten stages of precharge circuit units, for example, are connected for performing different logical operations. It should be noted that the number of stages between the precharge circuit units 950 and 960 depends on the duration of one machine cycle.

In the precharge circuit unit 950, a PMOSFET (p-type metal oxide semiconductor field effect transistor) 922 for controlling a precharge operation has a source connected to a power supply potential 921 and a drain connected to a drain of an NMOSFET (n-type metal oxide semiconductor field effect transistor) 911. The NMOSFET 911 has a source connected to a drain of an NMOSFET 912. The NMOSFET 912 has a source connected to a drain of an NMOSFET 923 for controlling a discharge operation, which has a source connected to a ground potential 924.

The serially connected NMOSFET 911 and NMOSFET 912 constitute a NAND circuit 910, wherein first input data is supplied to a gate 901 of the NMOSFET 911, and second input data is supplied to a gate 902 of the NMOSFET 912. A precharge node 926 on a line drawn from the drain of the PMOSFET 922 is connected to an invertor 925, such that output data is delivered from an output terminal of the invertor 925.

The operation of the precharge circuit unit 950 will be described. When the clock signal CK10 is at low level, the PMOSFET 922 is on and the NMOSFET 923 is off. Therefore, the precharge node 926 is precharged. When the clock signal CK10 changes to high level, the PMOSFET 922 turns off while the NMOSFET 923 turns on to determine, in accordance with the logical operation of the NAND circuit 910, whether a potential at the precharge node 926 is maintained as it is or it is discharged to the ground potential. More specifically, when the inputs 901, 902 of the NAND circuit 910 are both at high level, the NMOSFET 911 and the NMOSFET 912 are both on, so that the potential at the discharge node 926 is discharged to the ground potential, with the result that the precharge node 926 changes to low level. When at least one of the inputs 901, 902 of the NAND circuit 910 is at low level, the potential at the precharge node 926 is maintained, whereby the precharge node 926 remains at high level. In this way, the NAND circuit 910 operates in accordance with the NAND logic. It should be noted that since the precharge node 926 is connected to the invertor circuit 925, the precharge circuit unit 950 operates as an AND circuit.

In the precharge circuit unit 960, a PMOSFET 922 for controlling a precharge operation has a source connected to a power supply potential 921 and a drain connected to drains of an NMOSFET 931 and an NMOSFET 932. The NMOSFET 931 and the NMOSFET 932 have their sources connected to a drain of an NMOSFET 923 for controlling a discharge operation. A source of the NMOSFET 923 is connected to a ground potential 924.

The parallelly connected NMOSFET 931 and NMOSFET 932 constitute a NOR circuit 930, wherein first input data is supplied to a pate 903 of the NMOSFET 931, and second input data is supplied to a pate 904 of the NMOSFET 932. The first input is, for example, an output of a logical circuit at the preceding stage, while the second input is supplied, for example, from another logical circuit within the precharge circuit 102, as indicated by broken lines. A precharge node 926 on a line drawn from the drain of the PMOSFET 922 is connected to an invertor 925, such that output data 905 is delivered from an output terminal of the invertor 925.

Next, the operation of the precharge circuit 960 will be described. When the clock signal CK10 is at low level, the PMOSFET 922 is on and the NMOSFET 923 is off. Therefore, the precharge node 926 is precharged. When the clock signal CK10 changes to high level, the PMOSFET 922 turns off while the NMOSFET 923 turns on to determine, in accordance with the logical operation of the NOR circuit 930, whether a potential at the precharge node 926 is maintained as it is or it is discharged to the ground potential. More specifically, when the inputs 903, 904 of the NOR circuit 930 are both at low level, the NMOSFET 931 and the NMOSFET 932 are both off, so that the potential at the discharge node 926 is maintained, with the result that the precharge node 926 is at high level.

When at least one of the inputs to the NMOSFET 931 and the NMOSFET 932 is at high level, the potential at the precharge node 926 is discharged to the ground potential, so that the precharge node 926 is at low level. In this way, the NOR circuit 930 operates in accordance with the NOR logic. It should be noted that since the precharge node 926 is connected to the invertor circuit 925, the precharge circuit unit 960 operates as an OR circuit.

According to the first implementation of the precharge circuit, since logical circuits included in the precharge circuit are composed of NMOSFETs, the precharge circuit can operate faster than a precharge circuit having logical circuits composed of PMOSFETs.

Figure 4:
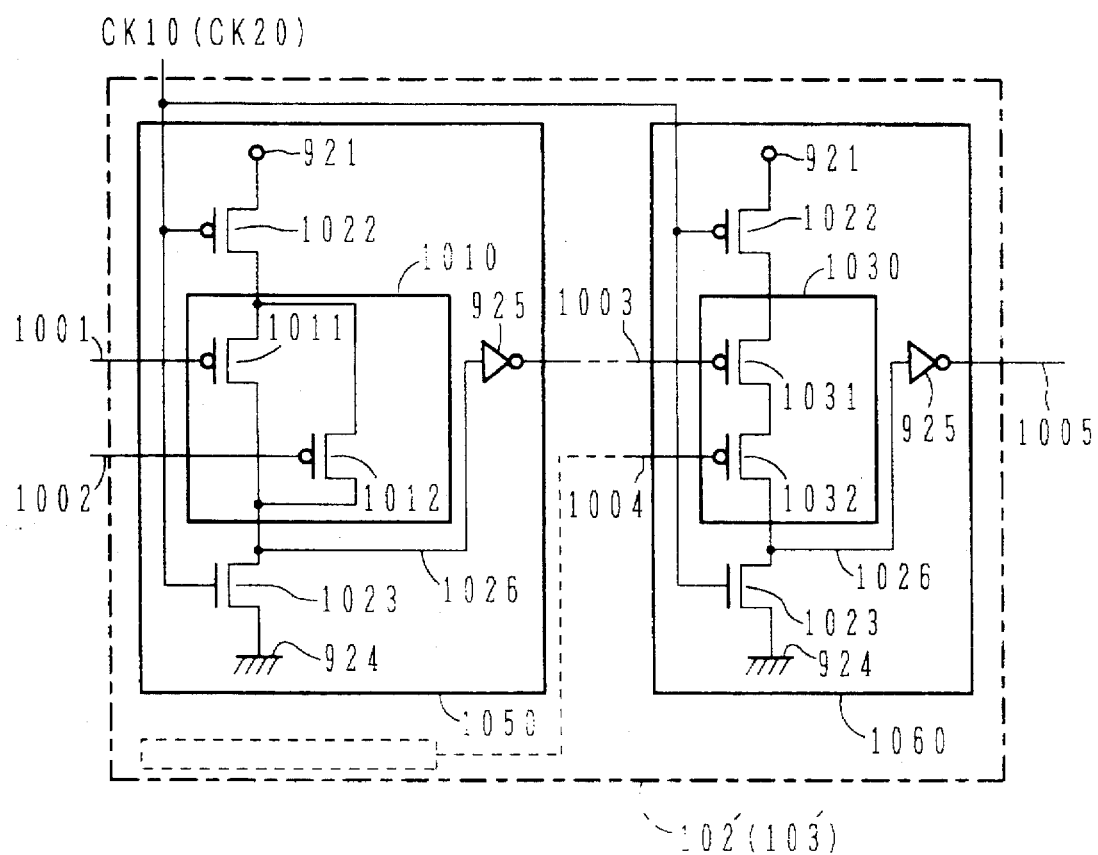
FIG. 4 is a circuit diagram illustrating a second precharge circuit used in the semiconductor integrated circuit device according to the first embodiment of the present invention.

Next, a second implementation of the precharge circuit will be described with reference to FIG. 4. FIG. 4 illustrates a circuit diagram of the second implementation of the precharge circuit which may be employed in the semiconductor integrated circuit according to the first embodiment of the present invention.

The precharge circuit 102 and the precharge circuit 103 illustrated in FIG. 1 have the same function since they provide the same output from an input. Therefore, the following description is made on the assumption that precharge circuits 102', 103' have the same circuit configuration.

The precharge circuit 102' (103') is composed of a plurality of precharge circuit units 1050, . . . , 1060. The precharge circuit units 1050, . . . , 1060 are controlled by the same clock signal CK10 (CK20) to alternate a precharge period and an active period.

The precharge circuit unit 1050 comprises a two-input NAND circuit, while the precharge circuit unit 1060 comprises a two-input NOR circuit. Between the precharge circuit unit 1050 and the precharge circuit unit 1060, approximately ten stages of precharge circuit units, for example, are connected for performing different logical operations. It should be noted that the number of stages between the precharge circuit units 1050 and 1060 depends on the duration of one machine cycle.

in the precharge circuit unit 1050, a PMOSFET 1022 for controlling a precharge operation has a source connected to a power supply potential 921 and a drain connected to sources of a PMOSFET 1011 and a PMOSFET 1012. Drains of the PMOSFET 1011 and the PMOSFET 1012 are connected to a drain of an NMOSFET 1023 for controlling a discharge operation. A source of the NMOSFET 1023 is connected to a ground potential 924. The parallelly connected PMOSFET 1011 and PMOSFET 1012 constitute a NAND circuit 1010, wherein first input data is supplied to a gate 1001 of the PMOSFET 1011, and second input data is supplied to a gate 1002 of the PMOSFET 1012. A precharge node 1026 on a line drawn from the drain of the PMOSFET 1023 is connected to an invertor 925, such that output data is delivered from an output terminal of the invertor 1025.

The operation of the precharge circuit unit 1050 will be described. When the clock signal CK10 is at high level, the PMOSFET 1022 is off and the NMOSFET 1023 is on. Therefore, the precharge node 1026 is previously discharged to the ground potential. When the clock signal CK10 changes to low level, the PMOSFET 1022 turns on while the NMOSFET 1023 turns off to determine, in accordance with the logical operation of the NAND circuit 1010, whether a potential at the precharge node 1026 is maintained as it is or it is pulled up to the power supply potential.

More specifically, when the inputs 1001, 1002 of the NAND circuit 1010 are both at high level, the PMOSFET 1011 and the PMOSFET 1012 are both off, so that the potential at the discharge node 1026 is maintained, with the result that the precharge node 1026 is at low level. When at least one of the inputs 1001, 1002 of the NAND circuit 1010 is at low level, the potential at the precharge node 1026 is pulled up to the power supply potential, whereby the precharge node 1026 changes to high level. In this way, the NAND circuit 1010 operates in accordance with the NAND logic. It should be noted that since the precharge node 1026 is connected to the invertor circuit 925, the precharge circuit unit 1050 operates as an AND circuit.

In the precharge circuit unit 1060, a PMOSFET 1022 for controlling a precharge operation has a source connected to a power supply potential 921 and a drain connected to a source of a PMOSFET 1031. The NMOSFET 1031 has a drain connected to a source of a PMOSFET 1032. The PMOSFET 1032 has a drain connected to a drain of an NMOSFET 1023 for controlling a discharge operation. A source of the NMOSFET 1023 is connected to a ground potential 924. The serially connected PMOSFET 1031 and PMOSFET 1032 constitute a NOR circuit 1030, wherein first input data is supplied to a gate 1003 of the PMOSFET 1031, and second input data is supplied to a gate 1004 of the NMOSFET 1032. The first input is, for example, an output of a logical circuit at the previous stage, while the second input is supplied, for example, from another logical circuit within the precharge circuit 102, as indicated by broken lines. A precharge node 1026 on a line drawn from the drain of the NMOSFET 1023 is connected to an invertor 925, such that output data 1005 is delivered from an output terminal of the invertor 925.

Next, the operation of the precharge circuit 1060 will be described. When the clock signal CK10 is at high level, the PMOSFET 1022 is off and the NMOSFET 1023 is on. Therefore, the precharge node 1026 is previously discharged to the ground potential. When the clock signal CK10 changes to low level, the PMOSFET 1022 turns on while the NMOSFET 1023 turns off to determine, in accordance with the logical operation of the NOR circuit 1030, whether a potential at the precharge node 926 is maintained as it is or it is pulled up to the power supply potential. More specifically, when the inputs 1003, 1004 of the NOR circuit 1030 are both at low level, the PMOSFET 1031 and the PMOSFET 1032 are both on, so that the potential at the discharge node 1026 is pulled up to the power supply potential, with the result that the precharge node 1026 changes to high level. When at least one of inputs to the PMOSFET 1031 and the PMOSFET 1032 is at high level, the potential at the precharge node 1026 is maintained, so that the precharge node 1026 is at low level. In this way, the NOR circuit 1030 operates in accordance with the NOR logic. It should be noted that since the precharge node 1026 is connected to the invertor circuit 925, the precharge circuit unit 1060 operates as an OR circuit.

According to the second implementation of the precharge circuit, since the logical circuits in the precharge circuit are composed of PMOSFETs, although its operating speed is lower than the precharge circuit composed as illustrated in FIG. 3, an input signal supplied to a precharge circuit connected at the next stage can be changed at a higher speed because the invertor circuit is operated by the NMOSFET. Therefore, if the input signal is a heavy load, the precharge circuit of the present invention can operate faster as the case may be.

Figure 5:
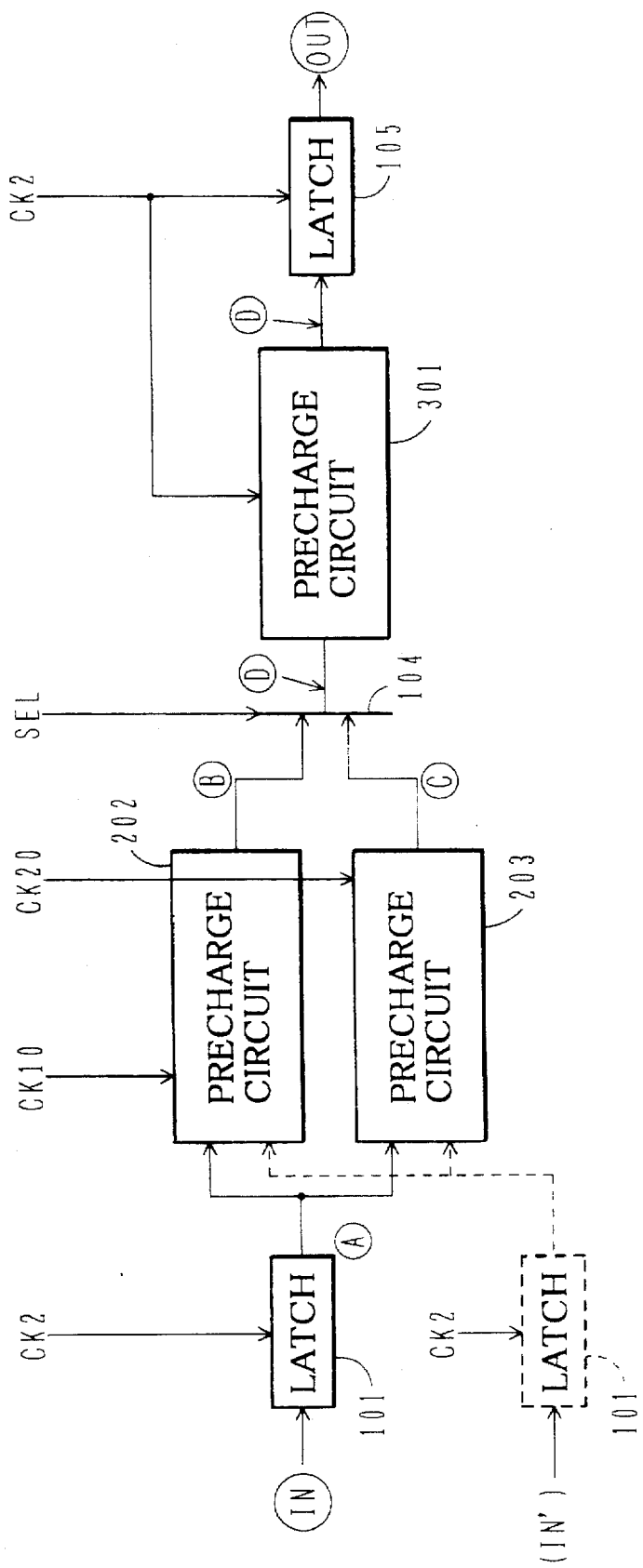
FIG. 5 is a block diagram illustrating a semiconductor integrated circuit device according to a second embodiment of the present invention.

Next, a second embodiment of the present invention will be described with reference to FIGS. 5 and 6A–6J. FIG. 5 illustrates a block diagram of a semiconductor integrated circuit device according to the second embodiment, and FIGS. 6A–6J are timing charts for explaining the operation of the semiconductor integrated circuit device according to the second embodiment of the present invention illustrated in FIG. 5.

Referring specifically to FIG. 5, a latch circuit 101 is controlled by a clock signal CK2 to be in a through period for passing input data IN therethrough when the clock signal CK2 is at high level and in a hold period for holding therein the input data IN when the clock signal CK2 is at low level.

An output of the latch circuit 101 is inputted to a precharge circuit 202 and to a precharge circuit 203, respectively. A precharge circuit has an internal node thereof set at a fixed potential during a precharge period and operates in an active period subsequent to the precharge period to propagate a signal therethrough. The precharge circuit may be implemented by circuits which exclusively perform propagation of a signal, such as a shift register, or by logical circuits for performing logical operations such as a NAND circuit and a NOR circuit. Further, the precharge circuit typically comprises a serially connected circuit units at a plurality of stages.

The precharge circuit 202 is controlled by a clock signal CK10 to be in a precharge period for precharging an internal node thereof when the clock signal CK10 is at low level and to operate in response to an output signal of the latch circuit 101 when the clock signal CK10 changes to high level. The clock signal CK10 employed herein has a period twice the period of the clock signal CK2, and the clock signal CK10 changes from low level to high level or from high level to low level, for example, at the timing of a falling edge of the clock signal CK2.

The precharge circuit 203, in turn, is controlled by a clock signal CK20 to be in a precharge period for precharging an internal node thereof when the clock signal CK20 is at low level and to operate in response to an output signal of the latch circuit 101 when the clock signal CK20 changes to high level. The clock signal CK20 employed herein has a period twice the period of the clocks signal CK2, and the clock signal CK20 changes from high level to low level or from low level to high level, for example, at the timing of a falling edge of the clock signal CK2. In other words, the clock signal CK20 is an inverted version of the clock signal CK10, i.e., the clock signal CK20 has the same period as and the opposite phase to the clock signal CK10.

Thus, when the clock signal CK10 is at low level, the precharge circuit 202 is in a precharge period, and at this time, the clock signal CK20 is at high level so that the precharge circuit 203 is in an active period. Conversely, when the clock signal CK10 is at high level, the precharge circuit 202 is in an active period, and at this time, the clock signal CK20 is at low level so that the precharge circuit 203 is in a precharge period. In other words, the precharge circuit 202 and the precharge circuit 203 are controlled to perform complementary operations.

In addition, the precharge circuit 202 and the precharge circuit 203 are each composed of circuits having the same functions which generate the same output for the same input. Thus, the precharge circuit 202 and the precharge circuit 203 are designed to perform complementary operations also from the fact that the two circuits having the same functions alternately operate. While only one of the precharge circuits 202, 203 can merely output result data once per two cycles of the clock signal CK2, a combination of them can virtually output result data in every cycle of the clock signal CK2 since the precharge circuit 202 and the precharge circuit 203 alternately operate every other cycle. It should be noted that the precharge circuit 202 and the precharge circuit 203 may be different in circuit configuration as long as they have the same input/output relationship.

Outputs of the precharge circuit 202 and the precharge circuit 203 are inputted to a selector 104. The selector 104 is controlled by a selection signal SEL to alternately select the output of the precharge circuit 202 and the output of the precharge circuit 203. As the selection signal SEL, a signal synchronized with the clock signal CK10 or the clock signal CK20 may be used. More specifically, the clock signal CK10 or the clock signal CK20 may be used.

An output signal of the precharge circuit 202 or the precharge circuit 203 selected by the selector 104 is inputted to a precharge circuit 301. The precharge circuit 301 is controlled by the clock signal CK2 to be in a precharge period for precharging an internal node thereof when the clock signal CK2 is at low level and to operate in response to an output signal of the selector 104 when the clock signal CK2 changes to high level. The clock signal CK2 employed herein has a period half the period of the clock signals CK10, CK20 for controlling the precharge circuits 202, 203 and is the same as the clock signal for controlling the latch circuit 101.

An output of the precharge circuit 301 is inputted to a latch circuit 105. The latch circuit 105 is controlled by the clock signal CK2 to be in a through period for passing a signal from the precharge circuit 301 therethrough when the clock signal CK2 is at high level and in a hold period for holding therein a signal from the precharge circuit 301 when the clock signal is at low level CK2. In this way, the latch circuit 105 delivers an output OUT.

While the precharge circuits 202, 203 have been described to be supplied with one kind of input data IN, each of the precharge circuits 202, 203 may be composed of logical circuits to perform a logical operation on two inputs thereof. In this case, a latch circuit 101' may be additionally provided for holding input data IN', as indicated by broken lines in FIG. 5, and controlled by the clock signal CK2 to supply the input data held therein to the respective precharge circuits 202, 203.

The second embodiment, compared with the first embodiment, does not merely differ from the first embodiment in that the precharge circuit 301 is added. A main difference therebetween lies in that the logical operations performed by the precharge circuits 102, 103 in FIG. 1 are divided so that they are performed at a former stage and at a latter stage. Specifically, the precharge circuits 202, 203 performs the operation at the former stage while the precharge circuit 301 performs the operation at the latter stage. More specifically, assuming that the precharge circuits 102, 103 illustrated in FIG. 1 performs logical operations at ten stages, the precharge circuits 202, 203 are allocated logical operations at the first six or seven stages while the precharge circuit 301 is allocated logical operations at the subsequent four or three stages. Particularly, the number of stages allocated to the precharge 301 is reduced to less than a half of all the stages, i.e., four stages or less, so that the precharge circuits 202, 203 are charged with the remaining more than half of the logical stages. This configuration is employed to prevent a dead time from occurring due to a determination to an output signal of the selector 104 before the clock signal CK2 goes high, because the precharge circuit 301 is controlled by the clock signal CK2 having a period half the period of the clock signals CK10, CK20 for controlling the precharge circuits 202, 203.

Next, the operation of the device illustrated in FIG. 5 will be explained with reference to timing charts of FIGS. 6A–6J.

Figure 6:
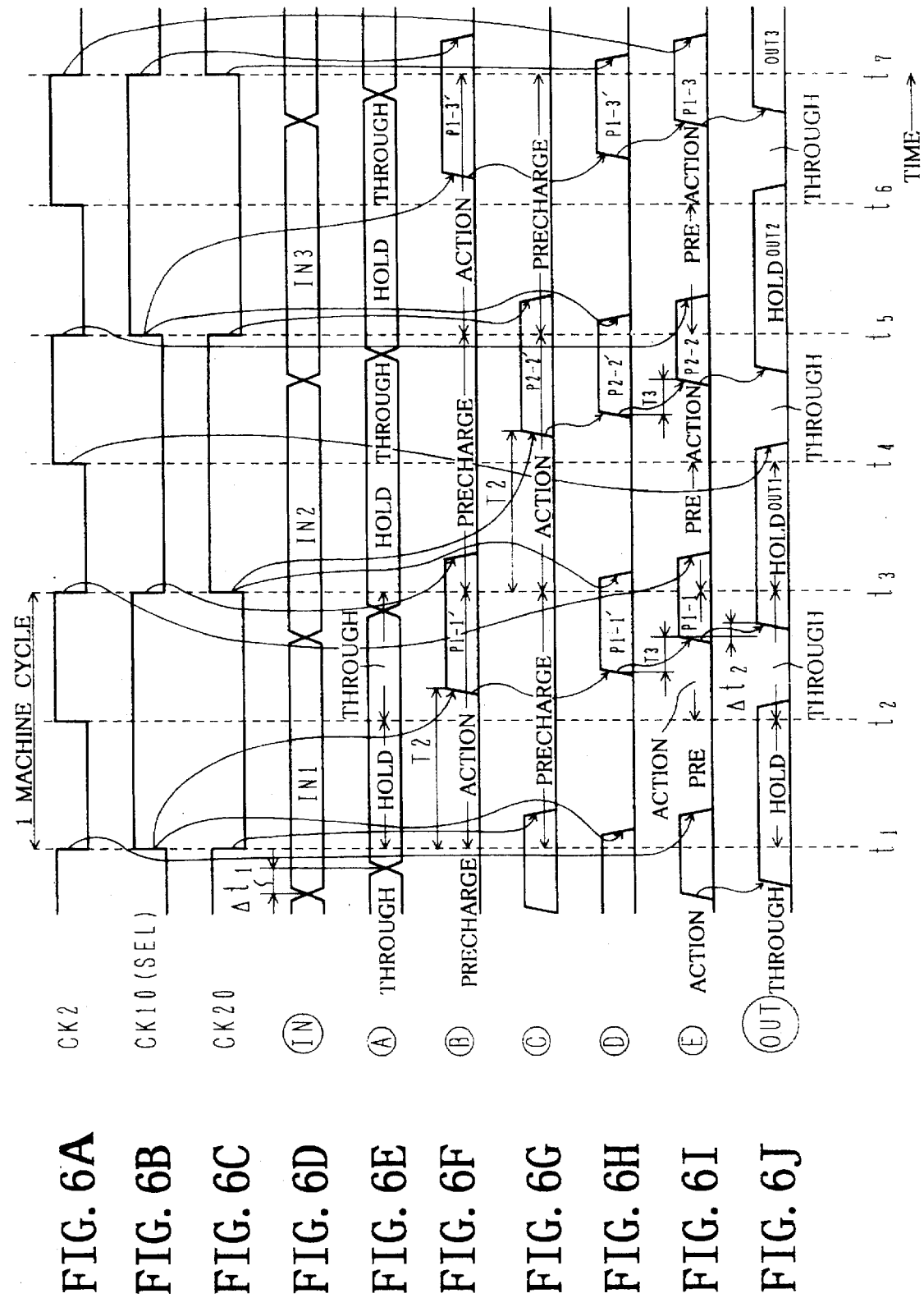
FIGS. 6A–6J are timing charts for explaining the operation of the semiconductor integrated circuit according to the second embodiment of the present invention illustrated in FIG. 5.

FIG. 6A illustrates a waveform chart of the clock signal CK2 for controlling the latch circuit 101 and the latch circuit 105. FIG. 6B illustrates a waveform chart of the clock signal CK10 for controlling the precharge circuit 202, which is also a waveform chart of the selection signal SEL for controlling the selector 104. FIG. 6C illustrates a waveform chart of the clock signal CK20 for controlling the precharge circuit 203. FIG. 6D represents input data IN supplied to the latch circuit 101. FIG. 6E represents output data of the latch circuit 101 at a point A in FIG. 5 and the operation of the latch circuit 101. FIG. 6F represents output data of the precharge circuit 202 at a point B in FIG. 5 and the operation of the precharge circuit 202. FIG. 6G represents output data of the precharge circuit 203 at a point C in FIG. 5 and the operation of the precharge circuit 203. FIG. 6H represents output data of the selector 104 at a point D in FIG. 5 and the operation of the selector 104. FIG. 6I represents output data of the precharge circuit 301 at a point E in FIG. 5 and the operation of the precharge circuit 301. FIG. 6J represents output data OUT of the latch circuit 105 and the operation of the latch circuit 105.

As illustrated in FIGS. 6A, 6B, the clock signal CK10 has a period twice the period of the clock signal CK2 and changes from low level to high level or from high level to low level at the timing of a falling edge of the clock signal CK2. Also, as illustrated in FIG. 6C, the clock signal CK20 has a period twice the period of the clock signal CK2, and changes from high level to low level or from low level to high level, for example, at the timing of a falling edge of the clock signal CK2.

Here, one cycle of the clock signal CK2 is defined to be one machine cycle of the semiconductor integrated circuit device of this embodiment.

Assume that input data IN1, IN2, IN3 in one machine cycle are sequentially inputted to the latch circuit 101, as illustrated in FIG. 6D.

The latch circuit 101 is controlled to be in a through period, for passing therethrough the input data IN, when the clock signal CK2 is at high level and in a hold period, for holding the input data IN therein, when the clock signal CK2 is at low level. Thus, as illustrated in FIG. 6E, a hold period appears from a time t1 to a time t2, followed by a through period from the time t2 to a time and subsequently, the hold period and the through period alternate in synchronism with the clock signal CK2. Also, as illustrated in FIGS. 6E, the input data IN1 to the latch circuit 101 appears at the output of the latch circuit 101 with a time delay Δt1 caused by the propagation of the input signal IN1 through the latch circuit 101. Since the latch circuit 101 is in the hold period from the time t1 to the time t2, the input data IN1 is held at the output of the latch circuit 101.

The precharge circuit 202 is controlled to be in a precharge period when the clock signal CK10 is at low level and to enter an active period for operating in response to output data of the latch circuit 101 when the clock signal CK10 changes to high level. Thus, as illustrated in FIG. 6F, an active period appears from the time t1 to the time t3, followed by a precharge period from the time t3 to a time t5, and subsequently, the active period and the precharge period alternate in synchronism with the clock signal CK10. At the time t1 at which the clock signal CK10 goes high, the precharge circuit 202 enters the active period and starts operating based on the input data IN1 held in the latch circuit 101 at this time. Assuming that the precharge circuit 202 takes a time period T2 for its operation, data P1-1' indicating the result of the operation of the precharge circuit 202 appears at the output of the precharge circuit 202 after the time period T2 from the time t1, as illustrated in FIG. 6F. Also, after the time period T2 from the time t5, data P1-3' indicting the result of the operation performed by the precharge circuit 202 on the input data IN3 appears at the output of the precharge circuit 202. It should be noted that in this event, the time period T2 required for the operation is shorter than the time period T1 required for the operation illustrated in FIG. 1. This is because the number of operation stages in the precharge circuit 202 is reduced as compared with the number of operation stages in the precharge circuit 102 in FIG. 1. However, the number of operation stages in the precharge circuit 202 is set such that the time period T2 is longer than one half of a machine cycle.

The precharge circuit 203, in turn, is controlled to be in a precharge period when the clock signal CK20 is at low level and to enter an active period for operating in response to output data of the latch circuit 101 when the clock signal CK20 changes to high level. Thus, as illustrated in FIG. 6G, a precharge period appears from the time t1 to the time t3, followed by an active period from the time t3 to the time t5, and subsequently, the active period and the precharge period alternate in synchronism with the clock signal CK20. At the time t3 at which the clock signal CK20 goes high, the precharge circuit 203 enters the precharge period and starts operating based on the input data IN2 held in the latch circuit 101 at this time. Assuming that the precharge circuit 203 takes the time period T2 for its operation, data P2-2' indicating the result of the operation of the precharge circuit 203 appears at the output of the precharge circuit 203 after the time period T2 from the time t3, as illustrated in FIG. 6G. It should be noted that in this event, the time period T2 required for the operation is shorter than the time period T1 required for the operation illustrated in FIG. 1. This is because the number of operation stages in the precharge circuit 203 is reduced as compared with the number of operation stages in the precharge circuit 103 in FIG. 1. However, the number of operation stages in the precharge circuit 203 is set such that the time period T2 is longer than one half of a machine cycle.

The selector 104 alternately selects the output of the precharge circuit 202 and the output of the precharge circuit 203 in response to the selection signal SEL. As the selection signal SEL, the clock signal CK10 is used, so that the selector 104 selects the outputs P1-1', P1-3' of the precharge circuit 202 when the clock signal CK10 is at high level, and the output P2-2' of the precharge circuit 203 when the clock signal CK10 is at low level, as illustrated in FIG. 6H.

The precharge circuit 301 is controlled to be in a precharge period when the clock signal CK2 is at low level and to enter an active period for operating in response to output data of the selector 104 when the clock signal CK2 changes to high level. Thus, as illustrated in FIG. 6I, an active period appears from the time t2 to the time t3, followed by a precharge period from the time t3 to a time t4, and subsequently, the active period and the precharge period alternate in synchronism with the clock signal CK2. At the time t2 at which the clock signal CK2 goes high, the precharge circuit 301 enters the active period and starts operating based on the output data P1-1' of the precharge circuit 202 selected by the selector 104 at this time.

Assuming that the precharge circuit 301 takes a time period T3 for its operation, data P1-1 indicating the result of the operation of the precharge circuit 301 appears at the output of the precharge circuit 310 after the time period T3 from the time at which the data P1-1' has been outputted, as illustrated in FIG. 6L. When the time period T3 required for the operation of the precharge circuit 301 is added to the time period T2 required for the operation of the precharge circuit 202, the sum is equal to the time period T1 required for the operation of the precharge circuit 102 illustrated in FIG. 1. Also, the number of operation stages in the precharge circuit 301 is set such that the time period T3 is shorter than one half of a machine cycle. The output data P1-1 of the precharge circuit 301 is the same as the output data P1-1 of the precharge circuit 102 in FIG. 1. The latch circuit 105 is controlled to be in a through period for passing input data therethrough when the clock signal CK2 is at high level and in a hold period for holding input data therein when the clock signal CK2 is at low level. Thus, as illustrated in FIG. 6J, a hold period appears from the time t1 to the time t2, followed by a through period from the time t2 to the time t3, and subsequently, the hold period and the through period alternate in synchronism with the clock signal CK2. Also, as illustrated in FIG. 6J, input data supplied to the latch circuit 105 appears at the output of the latch circuit 105 with a time delay $\Delta t2$ caused by the propagation of the input data through the latch circuit 105. Since the latch circuit 105 is in a hold period from the time t3 to the time t4, the latch circuit 105 holds the output data P1-1 of the precharge circuit 301, supplied thereto as input data, at its output as output data OUT1.

In other words, as illustrated in FIG. 6J, the latch circuit 105 delivers outputs resulting from the operation of the precharge circuit 202 or the precharge circuit 203 and the precharge circuit 301 performed on the input data IN1, IN2, IN3 supplied to the latch circuit 101 as the output data OUT1, OUT2, OUT3 every machine cycle.

Although the clock signals CK10, CK20, for controlling the precharge circuits 202, 203, respectively, have a period twice the period of the reference clock CK2, the precharge circuits 202, 203 are operated complementarily so that an output can be provided every machine cycle as if they were operated as a single precharge circuit. In addition, since the precharge circuits 202, 203 are complementarily operated using the clock signals CK10, CK20 having a period twice the period of the reference clock signal CK2, they can be operated without suffering from the influence of the phase difference skew. It should be noted that an in-phase skew does occur even in this case, however, the in-phase skew is one fifth or less as compared with the phase difference skew, and therefore hardly influences the operations of the precharge circuits 202, 203.

It will be appreciated from the foregoing description that the semiconductor integrated circuit device using precharge circuits, according to the second embodiment, is free from the influence of phase difference skew, and that the precharge circuits, capable of performing high speed operations, can be operated at high speed without any dead time due to a phase difference skew between clock signals.

In addition, since the circuit between the latch circuit on the input side and the latch circuit on the output side is divided into a former portion composed of two complementary precharge circuits and a latter portion composed of a single precharge circuit (having a plurality of operation stages), the number of transistors constituting the circuit can be reduced as compared with the first embodiment which is composed of parallelly arranged complementary precharge circuits for implementing all the operations. Thus, the second embodiment is advantageous over a configuration including two full sets of precharge circuits in that a circuit area can be reduced while the operating speed of the circuit can be maintained at an equal level.

Figure 7:
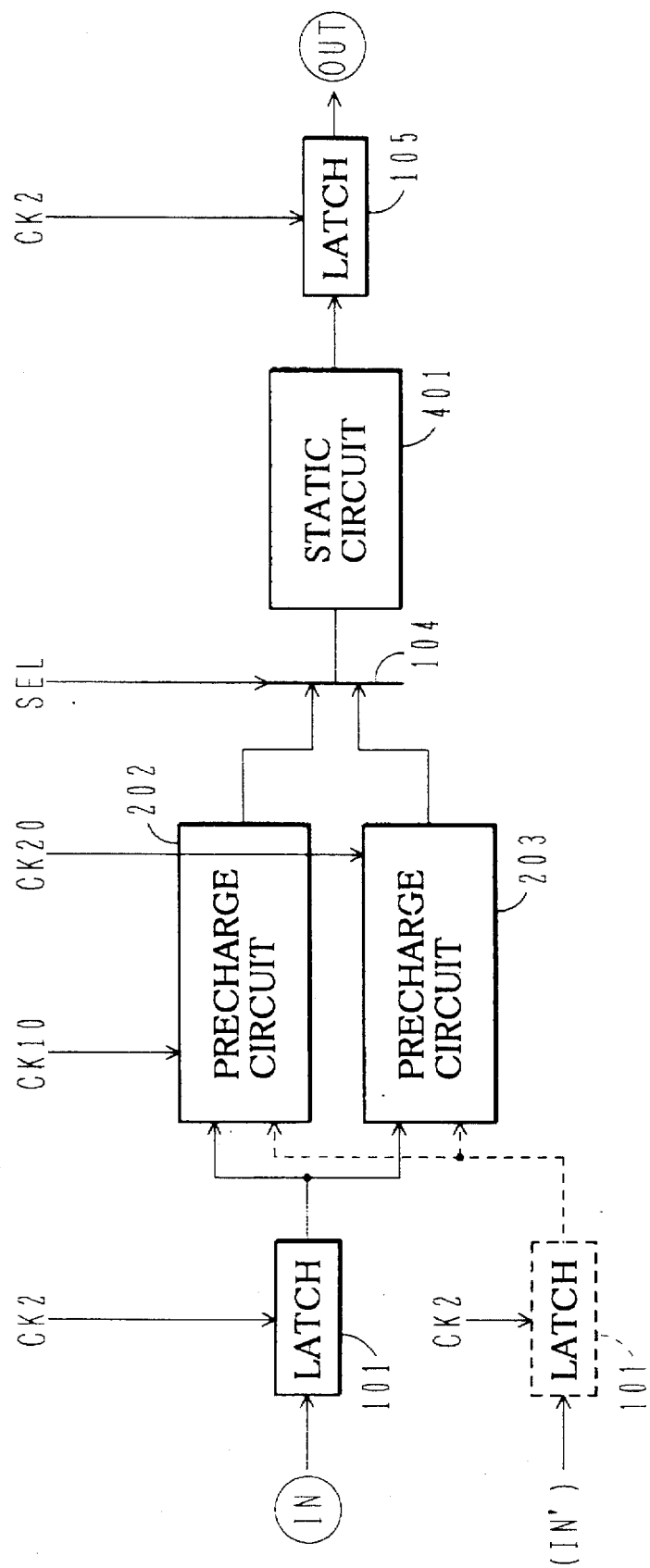
FIG. 7 is a block diagram illustrating a semiconductor integrated circuit device according to a third embodiment of the present invention.

Next, a third embodiment of the present invention will be described with reference to FIG. 7. FIG. 7 illustrates a block diagram of a semiconductor integrated circuit device according to the third embodiment of the present invention.

The circuit illustrated in FIG. 7 differs from the circuit illustrated in FIG. 5 in that the former employs a static circuit instead of the precharge circuit 301 which is a dynamic circuit.

Referring specifically to FIG. 7, a latch circuit 101 is controlled by a clock signal CK2 to be in a through period for passing input data IN therethrough when the clock signal CK2 is at high level and in a hold period for holding therein the input data IN when the clock signal CK2 is at low level.

An output of the latch circuit 101 is inputted to a precharge circuit 202 and to a precharge circuit 203, respectively. A precharge circuit has an internal node thereof set at a fixed potential during a precharge period and operates in an active period subsequent to the precharge period to propagate a signal therethrough. The precharge circuit may be implemented by circuits which exclusively perform propagation of a signal, such as a shift register, or by logical circuits for performing logical operations such as a NAND circuit and a NOR circuit. Further, the precharge circuit typically comprises a serially connected circuit units at a plurality of stages.

The precharge circuit 202 is controlled by a clock signal CK10 to be in a precharge period for precharging an internal node thereof when the clock signal CK10 is at low level and to operate in response to an output signal of the latch circuit 101 when the clock signal CK10 changes to high level. The clock signal CK10 employed herein has a period twice the period of the clock signal CK2, and the clock signal CK10 changes from low level to high level or from high level to low level, for example, at the timing of a falling edge of the clock signal CK2.

The precharge circuit 203, in turn, is controlled by a clock signal CK20 to be in a precharge period for precharging an internal node thereof when the clock signal CK20 is at low level and to operate in response to an output signal of the latch circuit 101 when the clock signal CK20 changes to high level. The clock signal CK20 employed herein has a period twice the period of the clocks signal CK2, and the clock signal CK20 changes from high level to low level or from low level to high level, for example, at the timing of a falling edge of the clock signal CK2. In other words, the clock signal CK20 is an inverted version of the clock signal CK10, i.e., the clock signal CK20 has the same period as and the opposite phase to the clock signal CK10.

Thus, when the clock signal CK10 is at low level, the precharge circuit 202 is in a precharge period, and at this time, the clock signal CK20 is at high level so that the precharge circuit 203 is in an active period. Conversely, when the clock signal CK10 is at high level, the precharge circuit 202 is in an active period, and at this time, the clock signal CK20 is at low level so that the precharge circuit 103 is in a precharge period. In other words, the precharge circuit 202 and the precharge circuit 203 are controlled to perform complementary operations.

In addition, the precharge circuit 202 and the precharge circuit 203 are each composed of circuits having the same functions which generate the same output for the same input. Thus, the precharge circuit 202 and the precharge circuit 203 are designed to perform complementary operations also from the fact that the two circuits having the same functions alternately operate. While only one of the precharge circuits 202, 203 can merely output result data once per two cycles of the clock signal CK2, a combination of them can virtually output result data in every cycle of the clock signal CK2 since the precharge circuit 202 and the precharge circuit 203 alternately operate every other cycle. It should be noted that the precharge circuit 202 and the precharge circuit 203 may be different in circuit configuration as long as they have the same input/output relationship.

Outputs of the precharge circuit 202 and the precharge circuit 203 are inputted to a selector 104. The selector 104 is controlled by a selection signal SEL to alternately select the output of the precharge circuit 202 and the output of the precharge circuit 203. As the selection signal SEL, a signal synchronized with the clock signal CK10 or the clock signal CK20 may be used. More specifically, the clock signal CK10 or the clock signal CK20 may be used.

An output signal of the precharge circuit 202 or the precharge circuit 203 selected by the selector 104 is inputted to a static circuit 401. The static circuit 401 operates independently of any clock signal used for controlling the other components.

An output of the static circuit 401 is inputted to a latch circuit 105. The latch circuit 105 is controlled by the clock signal CK2 to be in a through period for passing therethrough a signal from the static circuit 401 when the clock signal CK2 is at high level and in a hold period for holding therein a signal from the static circuit 401 when the clock signal CK2 is at low level. In this way, the latch circuit 105 delivers an output OUT.

While the precharge circuits 202, 203 have been described to be supplied with one kind of input data IN, each of the precharge circuits 202, 203 may be composed of logical circuits to perform a logical operation on two inputs thereof. In this case, a latch circuit 101' may be additionally provided for holding input data IN', as indicated by broken lines in FIG. 7, and controlled by the clock signal CK2 to supply the input data held therein to the respective precharge circuits 202, 203.

Comparing the third embodiment with the second embodiment illustrated in FIG. 5, as the static circuit 401 is employed instead of the precharge circuit 301 at the stage subsequent to the selector 104, a timing chart associated with the static circuit 401 is different in timing from the waveform chart illustrated in FIG. 6I. More specifically, the precharge period and the active period alternate in response to the clock signal CK2 in FIG. 6I since the precharge circuit 301 is employed, whereas the static circuit 401 operates in response to a change in an input signal supplied thereto.

As to operation times required for the precharge circuit 301 and the static circuit 401, the time period T3 shown in FIG. 6I is the operation time required for the precharge circuit 301 to perform its operation, whereas the static circuit 401 will take a longer time if the same operation is performed thereby. Thus, in the same machine cycle, the static circuit 401 has a less number of stages of operation circuits arranged therein, as compared with the precharge circuit 301.

However, since the static circuit 401 does not require a control using a clock signal, as the precharge circuit does, a division ratio between the precharge circuits 202, 203 and the static circuit 401 can be freely selected.

Also, the employment of the static circuit facilitates the design of the timing based on clock signals, as compared with the second embodiment illustrated in FIG. 5.

Further, the static circuit is advantageous over the precharge circuit in that a smaller circuit area may be required in some applications. The division ratio between the complementary precharge circuits and the static circuit may be determined such that the static circuit is made smaller if priority is given to a faster operation and the static circuit is made larger if priority is given to a reduction in circuit area.

It will be appreciated from the foregoing description that the semiconductor integrated circuit device using precharge circuits, according to the third embodiment, is free from the influence of phase difference skew, and that the precharge circuits, capable of performing high speed operations, can be operated at high speed without any dead time due to a phase difference skew between clock signals.

In addition, since the static circuit does not require a control using a clock signal, a freedom in design is increased.

Also, since a division ratio between the complementary precharge circuits and the static circuit can be arbitrarily selected, it is possible to design either a circuit for preferentially increasing the operating speed or a circuit for preferentially reducing a circuit area.

Figure 8:
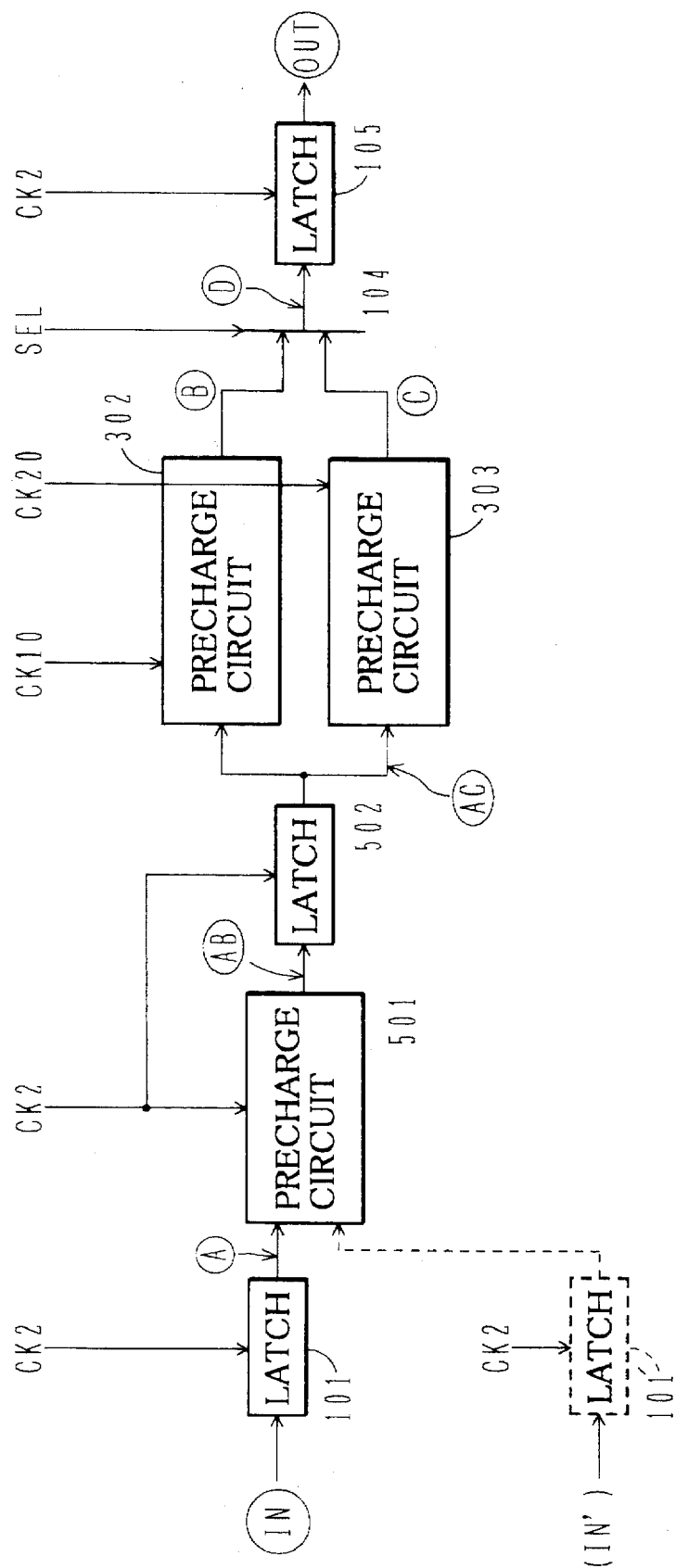
FIG. 8 is a block diagram illustrating a semiconductor integrated circuit device according to a fourth embodiment of the present invention.
Figure 9:
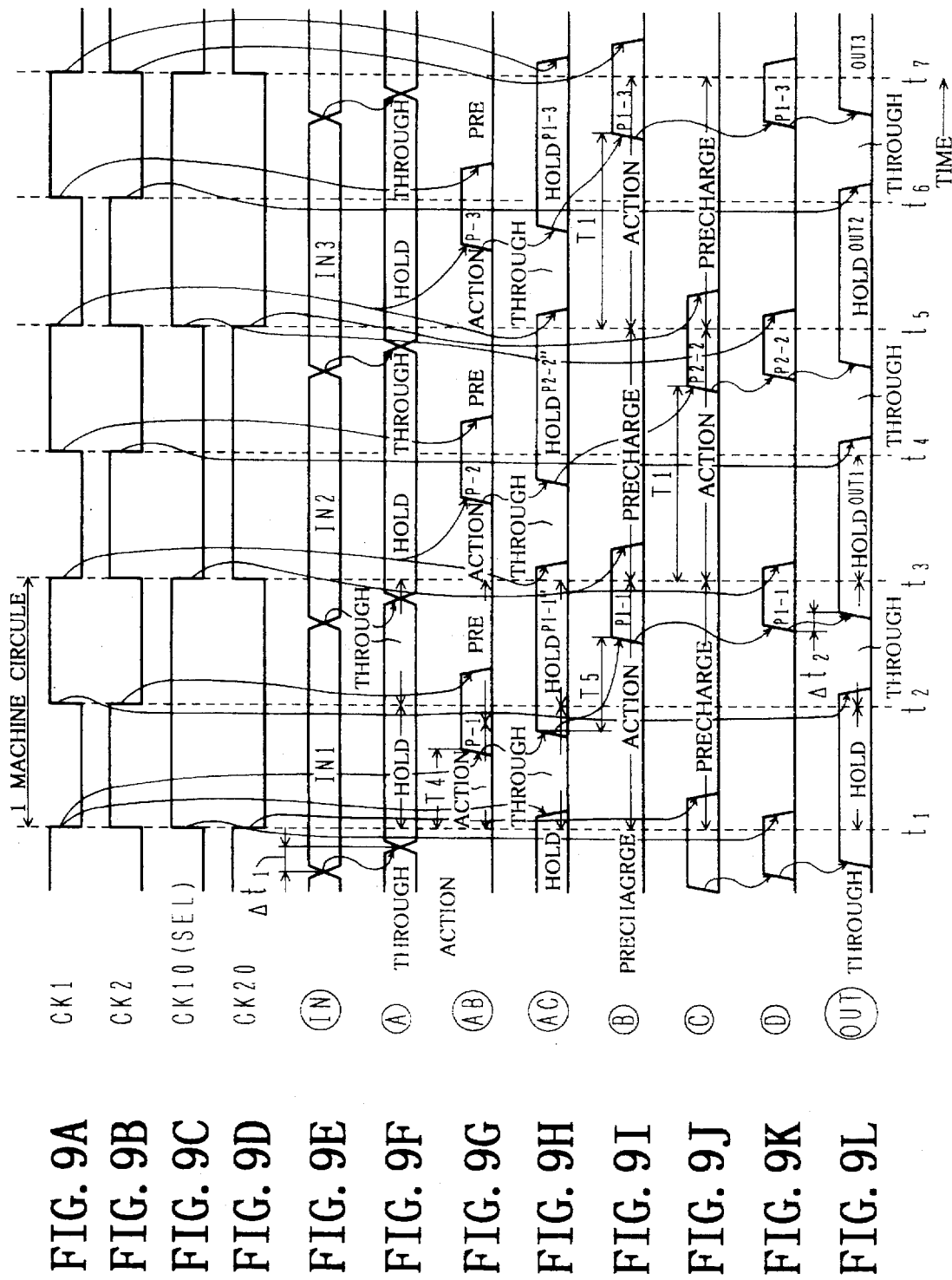
FIGS. 9A–9L are timing charts for explaining the operation of the semiconductor integrated circuit device according to the fourth embodiment of the present invention illustrated in FIG. 8.

Next, a fourth embodiment of the present invention will be described with reference to FIGS. 8, 9. FIG. 8 illustrates a block diagram of a semiconductor integrated circuit device according to the fourth embodiment of the present invention. FIGS. 9A–9L are timing charts for explaining the operation of the semiconductor integrated circuit device according to the fourth embodiment of the present invention illustrated in FIG. 8.

Referring specifically to FIG. 8, a latch circuit 101 is controlled by a clock signal CK2 to be in a through period for passing input data IN therethrough when the clock signal CK2 is at high level and in a hold period for holding therein the input data IN when the clock signal CK2 is at low level.

An output of the latch circuit 101 is inputted to a precharge circuit 501. A precharge circuit has an internal node thereof set at a fixed potential during a precharge period and operates in an active period subsequent to the precharge period to propagate a signal therethrough. The precharge circuit may be implemented by circuits which exclusively perform propagation of a signal, such as a shift register, or by logical circuits for performing logical operations such as a NAND circuit and a NOR circuit. Further, the precharge circuit typically comprises a serially connected circuit units at a plurality of stages.

The precharge circuit 501 is controlled by a clock signal CK1 to be in a precharge period for precharging an internal node thereof when the clock signal CK1 is at low level and to operate in response to an output signal of the latch circuit 101 when the clock signal CK1 changes to high level. The clock signal CK1 employed herein has the same period as and the opposite phase to the clock signal CK2.

An output of the precharge circuit 501 is inputted to a latch circuit 502. The latch circuit 502 is controlled by the clock signal CK1 to be in a through period for passing output data of the precharge circuit 501 therethrough when the clock signal CK1 is at high level and in a hold period for holding therein the output data when the clock signal CK1 is at low level.

An output of the latch circuit 502 is inputted to a precharge circuit 302 and a precharge circuit 303, respectively. In each of the precharge circuits, a plurality of circuits are serially connected at a plurality of stages.

The precharge circuit 302 is controlled by a clock signal CK10 to be in a precharge period for precharging an internal node thereof when the clock signal CK10 is at low level and to operate in response to an output signal of the latch circuit 502 when the clock signal CK10 changes to high level. The clock signal CK10 employed herein has a period twice the period of the clock signal CK2, and the clock signal CK10 changes from low level to high level or from high level to low level, for example, at the timing of a falling edge of the clock signal CK2.

The precharge circuit 303, in turn, is controlled by a clock signal CK20 to be in a precharge period for precharging an internal node thereof when the clock signal CK20 is at low level and to operate in response to an output signal of the latch circuit 502 when the clock signal CK20 changes to high level. The clock signal CK20 employed herein has a period twice the period of the clocks signal CK2, and the clock signal CK20 changes from high level to low level or from low level to high level, for example, at the timing of a falling edge of the clock signal CK2. In other words, the clock signal CK20 is an inverted version of the clock signal CK10, i.e., the clock signal CK20 has the same period as and the opposite phase to the clock signal CK10.

Thus, when the clock signal CK10 is at low level, the precharge circuit 302 is in a precharge period, and at this time, the clock signal CK20 is at high level so that the precharge circuit 303 is in an active period. Conversely, when the clock signal CK10 is at high level, the precharge circuit 302 is in an active period, and at this time, the clock signal CK20 is at low level so that the precharge circuit 303 is in a precharge period. In other words, the precharge circuit 302 and the precharge circuit 303 are controlled to perform complementary operations.

In addition, the precharge circuit 302 and the precharge circuit 303 are each composed of circuits having the same functions which generate the same output for the same input. Thus, the precharge circuit 302 and the precharge circuit 303 are designed to perform complementary operations also from the fact that the two circuits having the same functions alternately operate. While only one of the precharge circuits 302, 303 can merely output result data once per two cycles of the clock signal CK1, a combination of them can virtually output result data in every cycle of the clock signal CK1 since the precharge circuit 302 and the precharge circuit 303 alternately operate every other cycle. It should be noted that the precharge circuit 302 and the precharge circuit 303 may be different in circuit configuration as long as they have the same input/output relationship.

Outputs of the precharge circuit 302 and the precharge circuit 303 are inputted to a selector 104. The selector 104 is controlled by a selection signal SEL to alternately select the output of the precharge circuit 302 and the output of the precharge circuit 303. As the selection signal SEL, a signal synchronized with the clock signal CK10 or the clock signal CK20 may be used. More specifically, the clock signal CK10 or the clock signal CK20 may be used.

An output signal of the precharge circuit 302 or the precharge circuit 303 selected by the selector 104 is inputted to a latch circuit 105. The latch circuit 105 is controlled by the clock signal CK2 to be in a through period for passing a signal from the selector 104 therethrough when the clock signal CK2 is at high level and in a hold period for holding therein a signal from the selector 104 when the clock signal is at low level CK2. In this way, the latch circuit 105 delivers an output OUT.

While the precharge circuit 501 has been described to be supplied with one kind of input data IN, the precharge circuit 501 may be composed of logical circuits to perform a logical operation on two inputs thereof. In this case, a latch circuit 101' may be additionally provided for holding input data IN', as indicated by broken lines in FIG. 8, and controlled by the clock signal CK2 to supply the input data held therein to the precharge circuit 501.

The fourth embodiment, when compared with the second embodiment illustrated in FIG. 5, differs in that a precharge circuit is arranged at the former stage and two complementary precharge circuits are arranged at the latter stage in one machine cycle. Assuming that a total of ten stages of logical operations are performed in the whole semiconductor integrated circuit device, the precharge circuit 501 will be allocated the first three or four stages of the logical operations while the precharge circuits 302, 303 will be allocated the remaining seven or six stages of the logical operations at subsequent stages. It should be particularly noted that the precharge circuit 501 performs four stages or less, i.e., less than one half of the total stages of the logical operations while the precharge circuits 302, 303 perform more than one half of logical operation stages. This is because the precharge circuit 501 is controlled by the clock signal CK1 having a period half the period of the clock signals CK10, CK20 for controlling the precharge circuits 302, 303, so that an output signal of the latch circuit 502 must be determined before the clock signal CK1 goes low. Thus, the circuit configuration is designed so as to limit a total of a delay time of the precharge circuit 501 and a set-up time of the latch circuit 502 within a duration of the clock signal CK1 at high level.

Next, the operation of the device illustrated in FIG. 8 will be explained with reference to the timing charts of FIGS. 9A–9L.

FIG. 9A illustrates a waveform chart of the clock signal CK1 for controlling the precharge circuit 501 and the latch circuit 502. FIG. 9B illustrates a waveform chart of the clock signal CK2 for controlling the latch circuit 101 and the latch circuit 105. FIG. 9C illustrates a waveform chart of the clock signal CK10 for controlling the precharge circuit 302, which is also a waveform chart of the selection signal SEL for controlling the selector 104. FIG. 9D illustrates a waveform chart of the clock signal CK20 for controlling the precharge circuit 303. FIG. 9E represents input data IN supplied to the latch circuit 101. FIG. 9F represents output data of the latch circuit 101 at a point A in FIG. 8 and the operation of the latch circuit 101. FIG. 9G represents output data of the precharge circuit 501 at a point AB in FIG. 8 and the operation of the precharge circuit 501. FIG. 9H represents output data of the latch circuit 502 at a point AC in FIG. 8 and the operation of the latch circuit 502. FIG. 9I represents output data of the precharge circuit 302 at a point B in FIG. 8 and the operation of the precharge circuit 302. FIG. 9J represents output data of the precharge circuit 303 at a point C in FIG. 8 and the operation of the precharge circuit 303. FIG. 9K represents output data of the selector 104 at a point D in FIG. 8 and the operation of the selector 104. FIG. 9L represents output data OUT of the latch circuit 105 and the operation of the latch circuit 105.

As illustrated in FIGS. 9A, 9B, the clock signals CK1, CK2 have the same period and opposite phases to each other. As illustrated in FIG. 9C, the clock signal CK10 has a period twice the period of the clock signal CK2 and changes from low level to high level or from high level to low level at the timing of a falling edge of the clock signal CK2. Also, as illustrated in FIG. 9D, the clock signal CK20 has a period twice the period of the clock signal CK2, and changes from high level to low level or from low level to high level at the timing of a falling edge of the clock signal CK2.

Here, one cycle of the clock signal CK2 is defined to be one machine cycle of the semiconductor integrated circuit device of this embodiment.

Assume that input data IN1, IN2, IN3 in one machine cycle are sequentially inputted to the latch circuit 101, as illustrated in FIG. 9E.

The latch circuit 101 is controlled to be in a through period, for passing therethrough the input data IN, when the clock signal CK2 is at high level and in a hold period, for holding the input data IN therein, when the clock signal CK2 is at low level. Thus, as illustrated in FIG. 9F, a hold period appears from a time t1 to a time t2, followed by a through period from the time t2 to a time t3, and subsequently, the hold period and the through period alternate in synchronism with the clock signal CK2. Also, as illustrated in FIGS. 9F, the input data IN1 to the latch circuit 101 appears at the output of the latch circuit 101 with a time delay Δt1 caused by the propagation of the input signal IN1 through the latch circuit 101. Since the latch circuit 101 is in the hold period from the time t1 to the time t2, the input data IN1 is held at the output of the latch circuit 101.

The precharge circuit 501 is controlled by the clock signal CK1 to be in a precharge period when the clock signal CK1 is at low level and to enter an active period for operating in response to output data of the latch circuit 101 when the clock signal CK1 changes to high level. Thus, as illustrated in FIG. 9G, an active period appears from the time t1 to the time t2, followed by a precharge period from the time t2 to the time t3, and subsequently, the active period and the precharge period alternate in synchronism with the clock signal CK1. At the time t1 at which the clock signal CK1 goes high, the precharge circuit 501 enters the active period and starts operating based on the input data IN1 held in the latch circuit 101 at this time. Assuming that the precharge circuit 501 takes a time period T4 for its operation, data P-1 indicating the result of the operation of the precharge circuit 501 appears at the output of the precharge circuit 501 after the time period T4 from the time the data IN1 has been outputted, as illustrated in FIG. 9G.

The latch circuit 502 is controlled to be in a through period, for passing therethrough input data, when the clock signal CK1 is at high level and in a hold period, for holding the input data therein, when the clock signal CK1 is at low level. Thus, as illustrated in FIG. 9H, a hold period appears from the time t2 to the time t3, followed by a through period from the time t3 to a time t4, and subsequently, the hold period and the through period alternate in synchronism with the clock signal CK1. Since the latch circuit 502 is in the hold period from the time t2 to the time t3, the latch circuit 502 holds, at its output, output data P-1 of the precharge circuit 501 which is the input data supplied thereto.

The precharge circuit 302 is controlled to be in a precharge period when the clock signal CK10 is at low level and to enter an active period for operating in response to output data of the latch circuit 502 when the clock signal CK10 changes to high level. Thus, as illustrated in FIG. 9I, an active period appears from the time t1 to the time t3, followed by a precharge period from the time t3 to a time t5, and subsequently, the active period and the precharge period alternate in synchronism with the clock signal CK10. At the time t1 at which the clock signal CK10 goes high, the precharge circuit 302 enters the active period and starts operating based on the output data P-1 held in the latch circuit 502 at this time. Assuming that the precharge circuit 302 takes a time period T5 for its operation, data P1-1 indicating the result of the operation of the precharge circuit 302 appears at the output of the precharge circuit 302 after the time period T5 from the time t1, as illustrated in FIG. 9I. Also, data P1-3 indicating the result of the operation performed by the precharge circuit 302 on input data IN3 appears at the output of the precharge circuit 302. It should be noted that in this event, the time period T5 required for the operation is shorter than the time period T1 required for the operation of the circuit illustrated in FIG. 1. This is because the number of operation stages in the precharge circuit 302 is reduced as compared with the number of operation stages in the precharge circuit 102 in FIG. 1. However, the number of operation stages in the precharge circuit 302 is set such that the time period T5 is longer than one half of a machine cycle.

The precharge circuit 303, in turn, is controlled to be in a precharge period when the clock signal CK20 is at low level and to enter an active period for operating in response to output data of the latch circuit 502 when the clock signal CK20 changes to high level. Thus, as illustrated in FIG. 9J, a precharge period appears from the time t1 to the time t3, followed by an active period from the time t3 to the time t5, and subsequently, the precharge period and the active period alternate in synchronism with the clock signal CK20. At the time t3 at which the clock signal CK20 goes high, the precharge circuit 303 enters the precharge period and starts operating based on output data P-2 held in the latch circuit 502 at this time. Thus, data P2-2 indicating the result of the operation of the precharge circuit 303 appears at the output of the precharge circuit 203, as illustrated in FIG. 9J. It should be noted that in this event, the number of operation stages in the precharge circuit 303 is reduced as compared with the number of operation stages in the precharge circuit 103 in FIG. 1, and that the number of operation stages in the precharge circuit 303 is set such that its operation time is longer than one half of a machine cycle.

The selector 104 alternately selects the output of the precharge circuit 302 and the output of the precharge circuit 303 in response to the selection signal SEL. As the selection signal SEL, the clock signal CK10 is used, so that the selector 104 selects the outputs P1-1, P1-3 of the precharge circuit 302 when the clock signal CK10 is at high level, and selects the output P2-2 of the precharge circuit 303 when the clock signal CK10 is at low level.

The latch circuit 105 is controlled to be in a through period for passing input data therethrough when the clock signal CK2 is at high level and in a hold period for holding input data therein when the clock signal CK2 is at low level. Thus, as illustrated in FIG. 9L, a hold period appears from the time t1 to the time t2, followed by a through period from the time t2 to the time t3, and subsequently, the hold period and the through period alternate in synchronism with the clock signal CK2. Also, as illustrated in FIG. 9L, input data supplied to the latch circuit 105 appears at the output of the latch circuit 105 with a time delay Δt2 caused by the propagation of the input data through the latch circuit 105. Since the latch circuit 105 is in a hold period from the time t3 to the time t4, the latch circuit 105 holds, at its output, the output data P1-1 of the precharge circuit 302, supplied thereto as input data, at its output as output data OUT1.

In other words, as illustrated in FIG. 9L, the latch circuit 105 delivers outputs resulting from the operation of the precharge circuit 501 and the precharge circuit 302 or the precharge circuit 303 performed on the input data IN1, IN2, IN3 supplied to the latch circuit 101 as the output data OUT1, OUT2, OUT3 every machine cycle.

Although the clock signals CK10, CK20, for controlling the precharge circuits 302, 303, respectively, have a period twice the period of the reference clock CK2, the precharge circuits 302, 303 are operated complementarily so that an output can be provided every machine cycle as if they were operated as a single precharge circuit. In addition, since the precharge circuits 302, 303 are complementarily operated using the clock signals CK10, CK20 having a period twice the period of the reference clock signal CK2, they can be operated without suffering from the influence of the phase difference skew. It should be noted that an in-phase skew does occur even in this case, however, the in-phase skew is one fifth or less as compared with the phase difference skew, and therefore hardly influences the operations of the precharge circuits 302, 303.

It will be appreciated from the foregoing description that the semiconductor integrated circuit device using precharge circuits, according to the fourth embodiment, is free from the influence of phase difference skew, and that the precharge circuits, capable of performing high speed operations, can be operated at high speed without any dead time due to a phase difference skew between clock signals.

Figure 10:
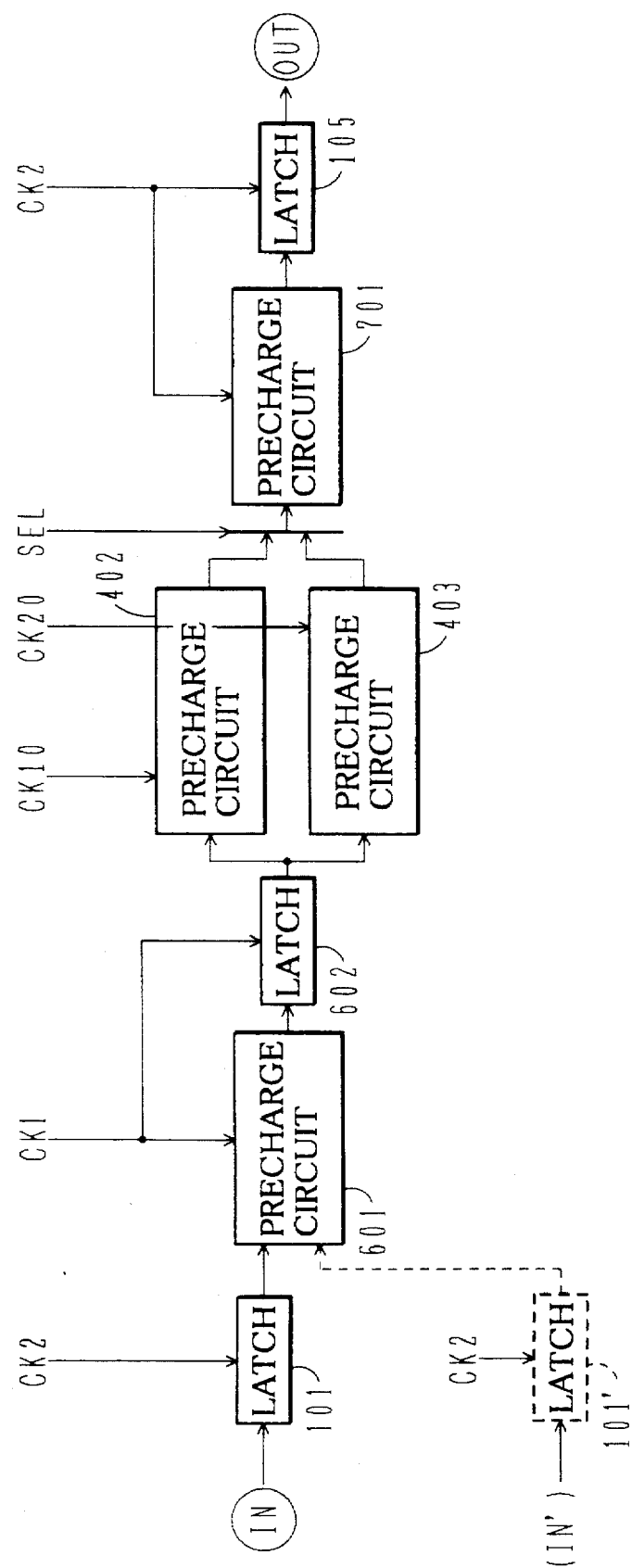
FIG. 10 is a block diagram illustrating a semiconductor integrated circuit device according to a fifth embodiment of the present invention.

In addition, since the circuit between the latch circuit on the input side and the latch circuit on the output side is divided into a former portion composed of a single precharge circuit (having a plurality of operation stages) and a latter portion composed of two complementary precharge circuits in a parallel arrangement, the number of transistors constituting the circuit can be reduced as compared with the first embodiment which is composed of parallelly arranged complementary precharge circuits for implementing all the operations. Thus, the fourth embodiment is advantageous over a configuration including two full sets of precharge circuits in that a circuit area can be reduced while the operating speed of the circuit can be maintained at an equal level. Next, a fifth embodiment of the present invention will be described with reference to FIG. 10. FIG. 10 illustrates a block diagram of a semiconductor integrated circuit device according to the fifth embodiment of the present invention.

Referring specifically to FIG. 10, a latch circuit 101 is controlled by a clock signal CK2 to be in a through period for passing input data IN therethrough when the clock signal CK2 is at high level and in a hold period for holding therein the input data IN when the clock signal CK2 is at low level.

An output of the latch circuit 101 is inputted to a precharge circuit 601. A precharge circuit has an internal node thereof set at a fixed potential during a precharge period and operates in an active period subsequent to the precharge period to propagate a signal therethrough. The precharge circuit may be implemented by circuits which exclusively perform propagation of a signal, such as a shift register, or by logical circuits for performing logical operations such as a NAND circuit and a NOR circuit. Further, the precharge circuit typically comprises a serially connected circuit units at a plurality of stages.

The precharge circuit 601 is controlled by a clock signal CK1 to be in a precharge period for precharging an internal node thereof when the clock signal CK1 is at low level and to operate in response to an output signal of the latch circuit 101 when the clock signal CK1 changes to high level. The clock signal CK1 employed herein has the same period as and the opposite phase to the clock signal CK2.

An output of the precharge circuit 601 is inputted to a latch circuit 602. The latch circuit 602 is controlled by the clock signal CK1 to be in a through period for passing output data of the precharge circuit 601 therethrough when the clock signal CK1 is at high level and in a hold period for holding therein the output data when the clock signal CK1 is at low level.

An output of the latch circuit 602 is inputted to a precharge circuit 402 and a precharge circuit 403, respectively. In each of the precharge circuits, a plurality of circuits are serially connected at a plurality of stages.

The precharge circuit 402 is controlled by a clock signal CK10 to be in a precharge period for precharging an internal node thereof when the clock signal CK10 is at low level and to operate in response to an output signal of the latch circuit 602 when the clock signal CK10 changes to high level. The clock signal CK10 employed herein has a period twice the period of the clock signal CK2, and the clock signal CK10 changes from low level to high level or from high level to low level, for example, at the timing of a falling edge of the clock signal CK2.

The precharge circuit 403, in turn, is controlled by a clock signal CK20 to be in a precharge period for precharging an internal node thereof when the clock signal CK20 is at low level and to operate in response to an output signal of the latch circuit 602 when the clock signal CK20 changes to high level. The clock signal CK20 employed herein has a period twice the period of the clocks signal CK2, and the clock signal CK20 changes from high level to low level or from low level to high level, for example, at the timing of a falling edge of the clock signal CK2. In other words, the clock signal CK20 is an inverted version of the clock signal CK10, i.e., the clock signal CK20 has the same period as and the opposite phase to the clock signal CK10.

Thus, when the clock signal CK10 is at low level, the precharge circuit 402 is in a precharge period, and at this time, the clock signal CK20 is at high level so that the precharge circuit 403 is in an active period. Conversely, when the clock signal CK10 is at high level, the precharge circuit 402 is in an active period, and at this time, the clock signal CK20 is at low level so that the precharge circuit 403 is in a precharge period. In other words, the precharge circuit 402 and the precharge circuit 403 are controlled to perform complementary operations.

In addition, the precharge circuit 402 and the precharge circuit 403 are each composed of circuits having the same functions which generate the same output for the same input. Thus, the precharge circuit 402 and the precharge circuit 403 are designed to perform complementary operations also from the fact that the two circuits having the same functions alternately operate. While only one of the precharge circuits 402, 403 can merely output result data once per two cycles of the clock signal CK1, a combination of them can virtually output result data in every cycle of the clock signal CK1 since the precharge circuit 402 and the precharge circuit 403 alternately operate every other cycle. It should be noted that the precharge circuit 402 and the precharge circuit 403 may be different in circuit configuration as long as they have the same input/output relationship.

Outputs of the precharge circuit 402 and the precharge circuit 403 are inputted to a selector 104. The selector 104 is controlled by a selection signal SEL to alternately select the output of the precharge circuit 402 and the output of the precharge circuit 403. As the selection signal SEL, a signal synchronized with the clock signal CK10 or the clock signal CK20 may be used. More specifically, the clock signal CK10 or the clock signal CK20 may be used.

An output signal of the precharge circuit 402 or the precharge circuit 403 selected by the selector 104 is inputted to a precharge circuit 701. The precharge circuit 701 is controlled by the clock signal CK2 to be in a precharge period for precharging an internal node thereof when the clock signal is at low level and to operate in response to an output signal of the selector 104 when the clock signal CK2 changes to high level. The clock signal CK2 employed herein has a period half the period of the clock signals CK10, CK20 for controlling the precharge circuits 202, 203 and is the same as the clock signal for controlling the latch circuit 101.

Output data of the precharge circuit 701 is inputted to a latch circuit 105. The latch circuit 105 is controlled by the clock signal CK2 to be in a through period for passing a signal from the precharge circuit 701 therethrough when the clock signal CK2 is at high level and in a hold period for holding therein a signal from the precharge circuit 701 when the clock signal CK2 is at low level. In this way, the latch circuit 105 delivers an output OUT.

While the precharge circuit 601 has been described to be supplied with one kind of input data IN, the precharge circuit 601 may be composed of logical circuits to perform a logical operation on two inputs thereof. In this case, a latch circuit 101' may be additionally provided for holding input data IN', as indicated by broken lines in FIG. 10, and controlled by the clock signal CK2 to supply the input data held therein to the precharge circuit 601.

It will be understood that the configuration of the fifth embodiment is implemented by a combination of the second embodiment of FIG. 5 and the fourth embodiment of FIG. 8, and is designed so as to limit a total of an operation time of the precharge circuit 601 and a set-up time of the latch circuit 602 within a duration of the clock signal CK1 at high level.

Also, the precharge circuit 701 is designed so as to limit its operation time within a duration of the clock signal CK2 at high level. In addition, the design of the integrated circuit device according to the fifth embodiment is made such that, at timing at which the clock signal CK1 changes from high level to low level and at timing at which the clock signal CK2 changes from low level to high level, the complementary precharge circuits composed of the precharge circuits 402, 403 are operated under the control of the clock signals CK10, CK20 which have a period longer than that of the clock signals CK1, CK2.

It will be appreciated from the foregoing description that the semiconductor integrated circuit device using precharge circuits, according to the fifth embodiment, is free from the influence of phase difference skew, and that the precharge circuits, capable of performing high speed operations, can be operated at high speed without any dead time due to a phase difference skew between clock signals.

In addition, the number of constituent transistors can be reduced as compared with the first embodiment which is composed of parallelly arranged complementary precharge circuits for implementing all the operations. Thus, the fifth embodiment is advantageous over a configuration including two full sets of precharge circuits in that a circuit area can be reduced while the operating speed of the circuit can be maintained at an equal level.

Figure 11:
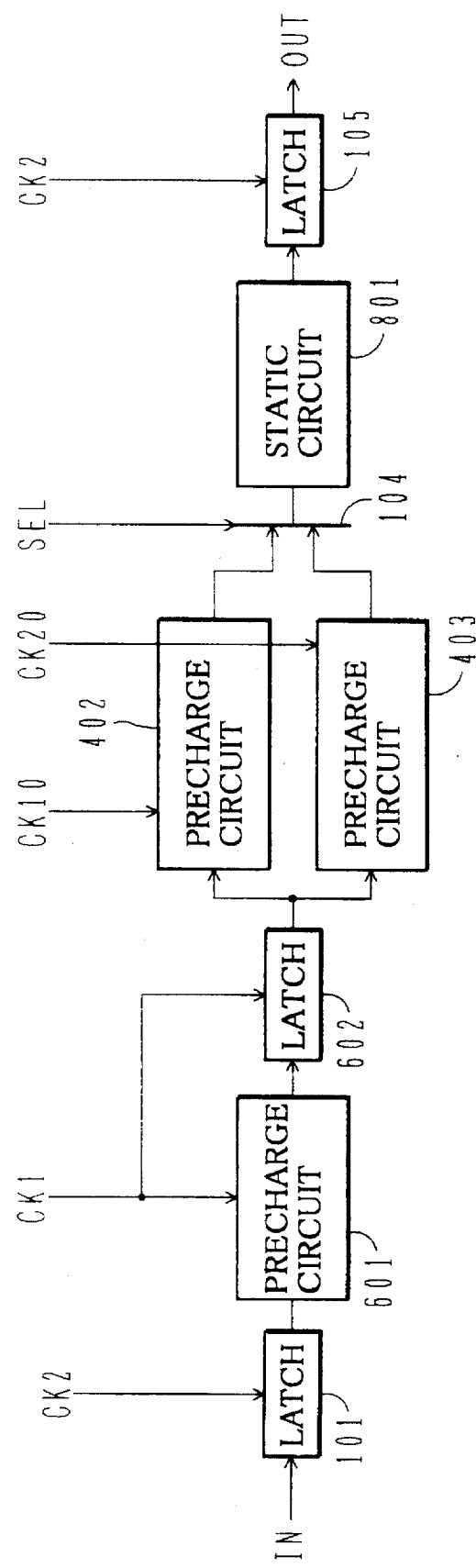
FIG. 11 is a block diagram illustrating a semiconductor integrated circuit device according to a sixth embodiment of the present invention.

Next, a sixth embodiment of the present invention will be described with reference to FIG. 11. FIG. 11 illustrates a block diagram of a semiconductor integrated circuit device according to the sixth embodiment of the present invention.

Referring specifically to FIG. 11, a latch circuit 101 is controlled by a clock signal CK2 to be in a through period for passing input data IN therethrough when the clock signal CK2 is at high level and in a hold period for holding therein the input data IN when the clock signal CK2 is at low level.

An output of the latch circuit 101 is inputted to a precharge circuit 601. A precharge circuit has an internal node thereof set at a fixed potential during a precharge period and operates in an active period subsequent to the precharge period to propagate a signal therethrough. The precharge circuit may be implemented by circuits which exclusively perform propagation of a signal, such as a shift register, or by logical circuits for performing logical Operations such as a NAND circuit and a NOR circuit. Further, the precharge circuit typically comprises a serially connected circuit units at a plurality of stages.

The precharge circuit 601 is controlled by a clock signal CK1 to be in a precharge period for precharging an internal node thereof when the clock signal CK1 is at low level and to operate in response to an output signal of the latch circuit 101 when the clock signal CK1 changes to high level. The clock signal CK1 employed herein has the same period as and the opposite phase to the clock signal CK2.

An output of the precharge circuit 601 is inputted to a latch circuit 602. The latch circuit 602 is controlled by the clock signal CK1 to be in a through period for passing output data of the precharge circuit 601 therethrough when the clock signal CK1 is at high level and in a hold period for holding therein the output data when the clock signal CK1 is at low level.

An output of the latch circuit 602 is inputted to a precharge circuit 401 and a precharge circuit 403, respectively. In each of the precharge circuits, a plurality of circuits are serially connected at a plurality of stages.

The precharge circuit 402 is controlled by a clock signal CK10 to be in a precharge period for precharging an internal node thereof when the clock signal CK10 is at low level and to operate in response to an output signal of the latch circuit 602 when the clock signal CK10 changes to high level. The clock signal CK10 employed herein has a period twice the period of the clock signal CK2, and the clock signal CK10 changes from low level to high level or from high level to low level, for example, at the timing of a falling edge of the clock signal CK2.

The precharge circuit 403, in turn, is controlled by a clock signal CK20 to be in a precharge period for precharging an internal node thereof when the clock signal CK20 is at low level and to operate in response to an output signal of the latch circuit 602 when the clock signal CK20 changes to high level. The clock signal CK20 employed herein has a period twice the period of the clocks signal CK2, and the clock signal CK20 changes from high level to low level or from low level to high level, for example, at the timing of a falling edge of the clock signal CK2. In other words, the clock signal CK20 is an inverted version of the clock signal CK10, i.e., the clock signal CK20 has the same period as and the opposite phase to the clock signal CK10.

Thus, when the clock signal CK10 is at low level, the precharge circuit 402 is in a precharge period, and at this time, the clock signal CK20 is at high level so that the precharge circuit 403 is in an active period. Conversely, when the clock signal CK10 is at high level, the precharge circuit 402 is in an active period, and at this time, the clock signal CK20 is at low level so that the precharge circuit 403 is in a precharge period. In other words, the precharge circuit 402 and the precharge circuit 403 are controlled to perform complementary operations. In addition, the precharge circuit 402 and the precharge circuit 403 are each composed of circuits having the same functions which generate the same output for the same input. Thus, the precharge circuit 402 and the precharge circuit 403 are designed to perform complementary operations also from the fact that the two circuits having the same functions alternately operate. While only one of the precharge circuits 402, 403 can merely output result data once per two cycles of the clock signal CK1, a combination of them can virtually output result data in every cycle of the clock signal CK1 since the precharge circuit 402 and the precharge circuit 403 alternately operate every other cycle. It should be noted that the precharge circuit 402 and the precharge circuit 403 may be different in circuit configuration as long as they have the same input/output relationship.

Outputs of the precharge circuit 402 and the precharge circuit 403 are inputted to a selector 104. The selector 104 is controlled by a selection signal SEL to alternately select the output of the precharge circuit 402 and the output of the precharge circuit 403. As the selection signal SEL, a signal synchronized with the clock signal CK10 or the clock signal CK20 may be used. More specifically, the clock signal CK10 or the clock signal CK20 may be used.

An output signal of the precharge circuit 402 or the precharge circuit 403 selected by the selector 104 is inputted to a static circuit 801. The static circuit 801 operates independently of any clock signal used for controlling the other components.

An output of the static circuit 801 is inputted to a latch circuit 105. The latch circuit 105 is controlled by the clock signal CK2 to be in a through period for passing a signal from the static circuit 801 therethrough when the clock signal CK2 is at high level and in a hold period for holding therein a signal from the static circuit 801 when the clock signal is at low level CK2. In this way, the latch circuit 105 delivers an output OUT.

The sixth embodiment, when compared with the fifth embodiment illustrated in FIG. 10, employs the static circuit 801 instead of the precharge circuit 701 at the latter stage. In the same machine cycle, the static circuit 801 has a less number of stages of operation circuits arranged therein, as compared with the precharge circuit 701.

However, since the static circuit 801 does not require a control using a clock signal, as the precharge circuit 701 does, a division ratio of the static circuit 801 to the other precharge circuits can be freely selected.

Also, the employment of the static circuit facilitates the design of the timing based on clock signals, as compared with the fifth embodiment illustrated in FIG. 10.

Further, the static circuit is advantageous over the precharge circuit in that a smaller circuit area may be required in some applications.

The division ratio between the precharge circuits and the static circuit may be determined such that the static circuit is made smaller if priority is given to a faster operation and the static circuit is made larger if priority is given to a reduction in circuit area.

It will be understood that the configuration of the sixth embodiment is implemented by a combination of the third embodiment of FIG. 7 and the fourth embodiment of FIG. 8, and is designed so as to limit a total of an operation time of the precharge circuit 601 and a set-up time of the latch circuit 602 within a duration of the clock signal CK1 at high level.

In addition, the design of the integrated circuit device according to the sixth embodiment is made such that, at timing at which the clock signal CK1 changes from high level to low level and at timing at which the clock signal CK2 changes from low level to high level, the complementary precharge circuits composed of the precharge circuits 402, 403 are operated under the control of the clock signals CK10, CK20 which have a period longer than that of the clock signals CK1, CK2.

It will be appreciated from the foregoing description that the semiconductor integrated circuit device using precharge circuits, according to the sixth embodiment, is free from the influence of phase difference skew, and that the precharge circuits, capable of performing high speed operations, can be operated at high speed without any dead time due to a phase difference skew between clock signals.

In addition, the number of constituent transistors can be reduced as compared with the first embodiment which is composed of parallelly arranged complementary precharge circuits for implementing all the operations. Thus, the sixth embodiment is advantageous over a configuration including two full sets of precharge circuits in that a circuit area can be reduced while the operating speed of the circuit can be maintained at an equal level.

Furthermore, since the static circuit does not require a control using a clock signal, a freedom in design is increased.

Also, since a division ratio between the complementary precharge circuits and the static circuit can be arbitrarily selected, it is possible to design either a circuit for preferentially increasing the operating speed or a circuit for preferentially reducing a circuit area.

Next, the foregoing embodiments will be summarized with reference to FIGS. 12A–12H. FIGS. 12A–12H are diagrams for explaining the concept of allocating an operation time to each of the components in the respective embodiments of the present invention.

FIG. 12A represents a waveform chart of the clock signal CK1. The clock signal CK1 is a clock signal which, for example, goes high at a time t1, goes low at a time t2, and again goes high at a time t3. FIG. 12B represents a waveform chart of the clock signal CK2 which is an inverted signal of the clock signal CK1.

FIG. 12C represents how operation times are allocated to the respective components of the first embodiment illustrated in FIG. 1. In FIG. 12C, "DUAL PRECHARGE" indicates the complementary precharge circuits 102, 103 in FIG. 1 which have an operation time T1. One machine cycle extends from the time t1 to the time t3, and the precharge circuits 102, 103 are designed so as to limit the operation time T1 within one cycle time. Since the complementary precharge circuits 102, 103 are controlled by the clock signals CK10, CK20, respectively, which have a period twice the period of the clock signal CK2, and a precharge period and an active period alternate within the time period from the time t1 to the time t3, so that the operation time T1 can be ensured.

"SELECTOR" in FIG. 12C indicates the selector circuit 104 which has an operation time Ts. "LATCH" indicates the latch circuit 105 which has a set-up time TL.

Thus, the circuit of the first embodiment is designed so as to limit a total of the operation time T1 of "DUAL PRECHARGE", the operation time Ts of "SELECTOR", and the set-up time TL of "LATCH" within one machine cycle.

In a conventional configuration using one precharge circuit, when a latch circuit is controlled by the clock signal CK1, the precharge circuit is controlled by the control signal CK2. Thus, the circuit must be designed so as to prevent the precharge circuit from operating during a time period from a time ta to a time tb in FIG. 12B, thus avoiding the influence of phase difference skew. Specifically, if the clock CK2 goes high, as indicated by a broken line at the time ta, before the clock signal CK1 goes low at the time t2, or if the clock signal CK2 goes high, as indicated by a broken line at the time tb, after the clock CK1 goes low at the time t2, a phase difference skew occurs. The period from the time ta to the time tb, in which the precharge circuit is prevented from operating, is a dead time.

The first embodiment of the present invention, on the other hand, employs the complementary precharge circuits and the clock signals CK10, CK20 having a period twice the period of the clock signal CK2, as clock signals for controlling the complementary precharge circuits, so that the operation time T1 can be ensured without arising the problem of the phase difference skew.

FIG. 12D represents how operation times are allocated to the respective components of the second embodiment illustrated in FIG. 5. In FIG. 12D, "DUAL PRECHARGE" indicates the complementary precharge circuits 202, 203 which have an operation time T2. "SINGLE PRECHARGE" indicates the precharge circuit 301 which has an operation time T3. "SELECTOR" indicates the selector circuit 104 which has an operation time Ts, and "LATCH" indicates the latch circuit 105 which has a set-up time TL.

Since the precharge circuit 301 is controlled by the clock signal CK2, the precharge circuit 301 is designed such that its operation time T3 is shorter than one half of the machine cycle. Thus, the second embodiment is designed so as to limit a total of the operation time T2 of "DUAL PRECHARGE", the operation time Ts of "SELECTOR", the operation time T3 of "SINGLE PRECHARGE", and the set-up time TL of the latch circuit 105 within one machine cycle.

Since the second embodiment of the present invention employs the complementary precharge circuits and the clock signals CK10, CK20 having a period twice the period of the clock signal CK2 as clock signals for controlling the complementary precharge circuits, the problem of the phase difference skew can be avoided. Also, a required circuit area can be reduced by employing the precharge circuit 301, the operation time of which is shorter than one half of the machine cycle.

FIG. 12E represents how operation times are allocated to the respective components of the third embodiment illustrated in FIG. 7. In FIG. 12E, "DUAL PRECHARGE" indicates the complementary precharge circuits 202, 203 which have an operation time T2. "STATIC" in FIG. 12E indicates the static circuit 401 which has an operation time T3. "SELECTOR" indicates the selector circuit 104 which has an operation time Ts, and "LATCH" indicates the latch circuit 105 which has a set-up time TL.

Thus, the third embodiment is designed so as to limit a total of the operation time T2 of "DUAL PRECHARGE", the operation time Ts of "SELECTOR", the operation time T3 of "STATIC", and the set-up time TL of "LATCH" within one machine cycle.

Since the third embodiment of the present invention employs the complementary precharge circuits and the clock signals CK10, CK20 having a period twice the period of the clock signal CK2 as clock signals for controlling the complementary precharge circuits, the problem of the phase difference skew can be avoided. Also, a circuit area can be reduced by employing the static circuit.

In comparison with FIG. 12D illustrating the second embodiment, the static circuit used in the third embodiment requires a longer operation time than the precharge circuit used in the second embodiment, so that the number of operation stages available must be reduced. However, the third embodiment is advantageous in that the freedom in design increases because the static circuit does not require a clock signal for its control.

FIG. 12F represents how operation times are allocated to the respective components of the fourth embodiment illustrated in FIG. 8. "SINGLE PRECHARGE" in FIG. 12F indicates the precharge circuit 501 which has an operation time T4. "DUAL PRECHARGE" indicates the complementary precharge circuits 302, 303 which have an operation time T5. "SELECTOR" indicates the selector circuit 104 which has an operation time Ts, and "LATCH" indicates each of the latch circuits 502, 105 which have a set-up time TL.

Since the precharge circuit 501 is controlled by the clock CK1, the precharge circuit 501 is designed such that its operation time T4 is shorter than one half of the machine cycle.

Thus, the fourth embodiment is designed so as to limit a total of the operation time T4 of "SINGLE PRECHARGE", the operation time T5 of "DUAL PRECHARGE", the operation time Ts of "SELECTOR", and the set-up times 2 TL of the two "LATCHes" within one machine cycle.

Since the fourth embodiment of the present invention employs the complementary precharge circuits and the clock signals CK10, CK20 having a period twice the period of the clock signal CK2 as clock signals for controlling the complementary precharge circuits, the problem of the phase difference skew can be avoided. Also, a required circuit area can be reduced by employing the precharge circuit 501, the operation time of which is shorter than one half of the machine cycle.

FIG. 12G represents how operation times are allocated to the respective components of the fifth embodiment illustrated in FIG. 10. "SINGLE PRECHARGE" in FIG. 12G indicates each of the precharge circuits 601, 701 which have operation times T6, T8, respectively. "DUAL PRECHARGE" indicates the complementary precharge circuits 402, 403 in FIG. 10 which have an operation time T7. "SELECTOR" indicates the selector circuit 104 which has an operation time Ts, and "LATCH" indicates each of the latch circuits 602, 105 which have a set-up time TL.

Since the precharge circuits 601, 701 are controlled by the clock signals CK1, CK2, respectively, the precharge circuits 601, 701 are designed such that their operation times T6, T8 are shorter than one half of the machine cycle.

Thus, the fifth embodiment is designed so as to limit a total of the operation times T6, T8 of "SINGLE PRECHARGEs", the operation time T7 of "DUAL PRECHARGE", the operation time Ts of "SELECTOR", and the set-up times 2 TL of the two "LATCHes" within one machine cycle.

Since the fourth embodiment of the present invention employs the complementary precharge circuits and the clock signals CK10, CK20 having a period twice the period of the clock signal CK2 as clock signals for controlling the complementary precharge circuits, the problem of the phase difference skew can be avoided. Also, a required circuit area can be reduced by employing the precharge circuits 601, 701, the operation time of which is shorter than one half of the machine cycle.

FIG. 12H represents how operation times are allocated to the respective components of the sixth embodiment illustrated in FIG. 11. "SINGLE PRECHARGE" in FIG. 12H indicates the precharge circuit 601 which has operation times T6. "DUAL PRECHARGE" indicates the complementary precharge circuits 402, 403 in FIG. 11 which have an operation time T7. "STATIC" indicates the static circuit 801 which has an operation time T8. "SELECTOR" indicates the selector circuit 104 which has an operation time Ts, and "LATCH" indicates the latch circuits 602, 105 which have a set-up time TL.

Since the precharge circuit 601 is controlled by the clock signals CK1, the precharge circuit 601 is designed such that its operation time T6 is shorter than one half of the machine cycle.

Thus, the sixth embodiment is designed so as to limit a total of the operation time T6 of "SINGLE PRECHARGE", the operation time T7 of "DUAL PRECHARGE", the operation time T8 of "STATIC", the operation time Ts of "SELECTOR", and the set-up times 2 TL of the two "LATCHes" within one machine cycle.

Since the sixth embodiment of the present invention employs complementary precharge circuits and the clock signals CK10, CK20 having a period twice the period of the clock signal CK2, as clock signals for controlling the complementary precharge circuits, the problem of the phase difference skew can be avoided. Also, a required circuit area can be reduced by employing the precharge circuit 601, the operation time of which is shorter than one half of the machine cycle. In addition, a circuit area can be reduced by employing the static circuit.

As an aspect common to the respective embodiments shown in FIGS. 12C–12H, "DUAL PRECHARGE" representing the complementary precharge circuits is located in one machine cycle such that the complementary precharge circuits operate within a time zone from the time ta to the time tb in which a phase difference skew can occur in the clock signals CK1, CK2. In this way, the influence of the phase difference skew can be avoided by locating the circuits which are controlled by clock signals having a period twice the period of a reference clock signal and free from the influence of a phase difference skew of the reference clock signal so that the circuits operate in the time zone from the time ta to the time tb.

While in the respective embodiments described above, two precharge circuits are used in a complementary configuration and controlled by clock signals having a period twice the period of the reference clock signal CK2, the present invention may employ, as control clock signals for the complementary precharge circuits, those having a period which is an integer multiple of the period of the reference clock signal, for example, those having a period three or four times the period of the reference clock signal. In this case, for realizing an operation equivalent to that performed by a set of precharge circuits controlled by reference clock signals, if a clock signal having a period three times the period of the reference clock signal is employed, a set of three precharge circuits must be parallelly connected in a complementary configuration and controlled by three clocks having phases shifted by 120 from each other. Likewise, if a clock signal having a period four times the period of the reference clock signal is employed, a set of four precharge circuits must be parallelly connected in a complementary configuration to each other.

Figure 13:
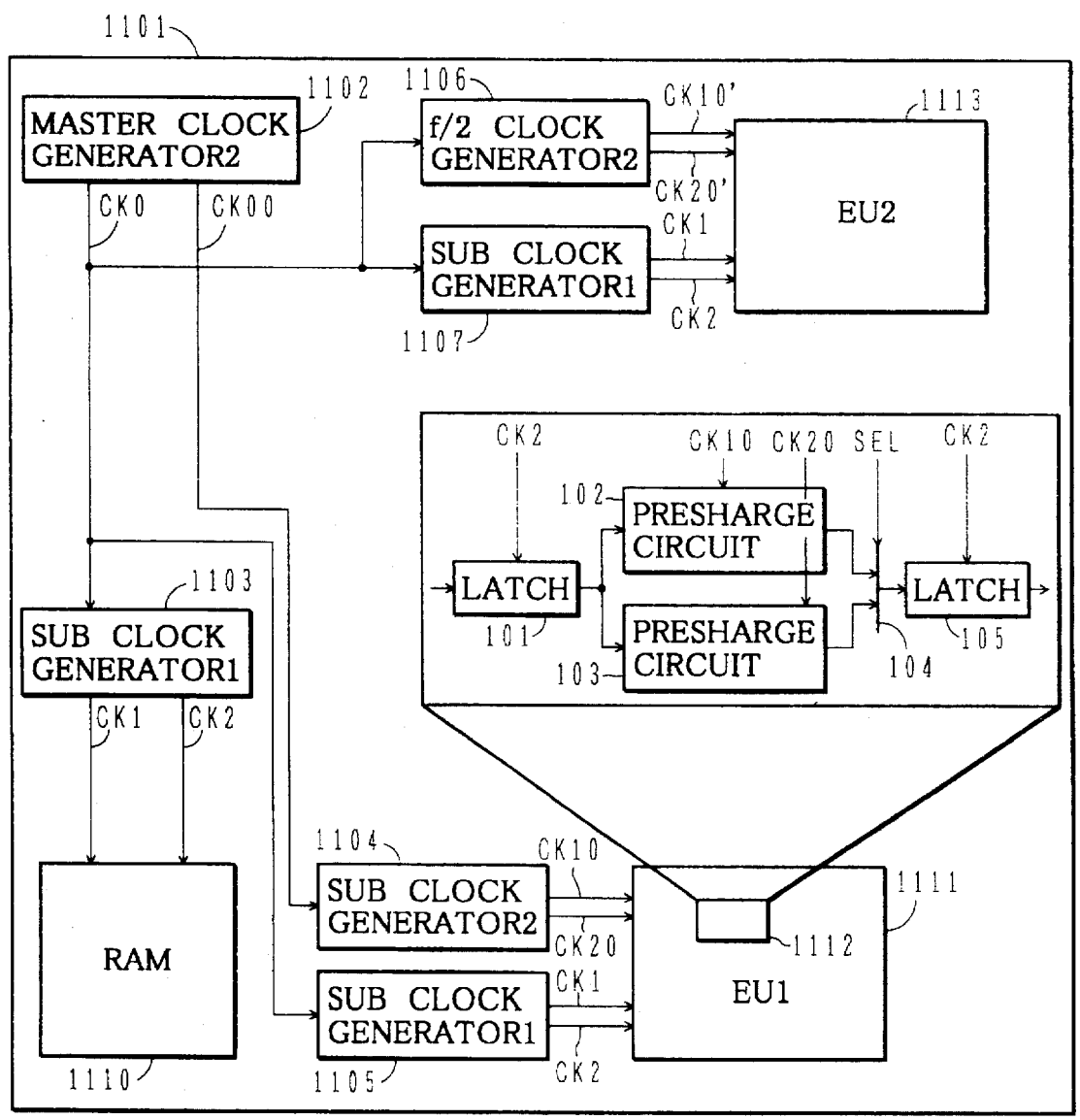

FIG. 13 illustrates a block diagram of a logical LSI such as a microprocessor to which the present invention is applied.

On an LSI chip 1101, a RAM 1110, a first processor 1111, and a second processor 1113 are formed. In the first processor 1111, for example, the circuit device according to the first embodiment of the present invention, illustrated in FIG. 1, is implemented in a portion 1112 thereof.

Specifically, a latch circuit 101 is controlled by a clock signal CK2 to be in a hold period for holding input data IN when the clock signal CK2 is at low level.

An output of the latch circuit 101 is inputted to a precharge circuit 102 and to a precharge circuit 103, respectively. The precharge circuit 102 is controlled by a clock signal CK10 to operate in response to an output signal of the latch circuit 101 when the clock signal CK10 changes to high level.

The precharge circuit 103, in turn, is controlled by a clock signal CK20 to operate in response to an output signal of the latch circuit 101 when the clock signal CK20 changes to high level. The clock signal CK20 employed herein is an inverted version of the clock signal CK10, i.e., the clock signal CK20 has the same period as and the opposite phase to the clock signal CK10. Thus, the precharge circuit 102 and the precharge circuit 103 are controlled to perform complementary operations.

Outputs of the precharge circuit 102 and the precharge circuit 103 are inputted to a selector 104. The selector 104 is controlled by a selection signal SEL to alternately select the output of the precharge circuit 102 and the output of the precharge circuit 103.

An output signal of the precharge circuit 102 or the precharge circuit 103 selected by the selector 104 is inputted to a latch circuit 105. The latch circuit 105 is controlled by the clock signal CK2 to be in a hold period for holding therein a signal from the precharge circuit 102 or 103 when the clock signal CK2 is at low level. In this way, the latch circuit 105 delivers an output OUT.

The LSI chip 1101 is additionally provided with a master clock signal generator 1102 formed thereon for generating clock signals for controlling the RAM 1110, the first processor 1111, and the second processor 1113. The master clock signal generator 1102 comprises, for example, a phase locked loop (PLL) and outputs clock signals CK0, CK00. Alternatively, the master clock signals may be supplied from the outside of the LSI chip 1101. The clock signal CK0 is supplied to all the components in the chip, and the clock signal CK00 has a period twice the period of the clock signal CK0.

A sub-clock signal generator 1103 is formed near the RAM 1110. The sub-clock generator 1103 is a first sub-clock signal generator which receives the clock signal CK0 to generate therefrom the clock signals CK1,CK2 mentioned in the aforementioned embodiments. Another sub-clock signal generator 1105 is also formed near the first processor 1111, and receives the clock signal CK0 to generate therefrom the clock signals CK1, CK2 mentioned in the aforementioned embodiments.

A further sub-clock signal generator 1104 is formed near the first processor 1111. The sub-clock signal generator 1104 is a second sub-clock signal generator which receives the clock signal CK00 to generate therefrom the clock signals CK10, CK20 mentioned in the aforementioned embodiments.

In an alternative embodiment, a sub-clock signal generator 1107 may be formed near the second processor 1113. The sub-clock signal generator 1107 similarly receives the clock signal CK0 to generate therefrom the clock signals CK1, CK2 mentioned in the aforementioned embodiments. In addition, a second sub-clock signal generator 1106 is formed near the second processor 1113, and receives the clock signal CK10 and divides the received clock signal CK0 by two to generate the clock signals CK10', CK20' mentioned in the aforementioned embodiments. This configuration, however, is limited only in the case where the master clock signal CK00, having a period twice the period of the clock signal CK0, cannot be generated.

According to this embodiment, the present invention can be applied to a critical path in a logical LSI and so on, represented by a microprocessor, to realize a logical LSI which is operable at a higher speed.

Further, the present invention can be applied to a read circuit for a memory LSI and so on to reduce an access time required to access the memory LSI.

According to the present invention, it is possible to employ a precharge circuit free from the influence of a phase difference skew in a semiconductor integrated circuit device.

What is claimed is:

1. A semiconductor integrated circuit device having a precharge circuit controlled by clock signals, wherein an arbitrary node of said precharge circuit is precharged during a low level period or a high level period of an associated one of said clock signals and said precharge circuit is active during a high level period or a low level period of said associated clock signal, said semiconductor integrated circuit device comprising:

a first precharge circuit and a second precharge circuit having the same operational functions and arranged in parallel, wherein said first precharge circuit and said second precharge circuit are controlled such that said first precharge circuit and said second precharge circuit perform complementary operations, wherein said second precharge circuit is in an active period when said first precharge circuit is in a precharge period, and said second precharge circuit is in a precharge period when said first precharge circuit is in an active period.

2. A semiconductor integrated circuit device according to claim 1, further comprising:

a latch circuit connected at a stage previous to said first and second precharge circuits; and a selector circuit connected at a stage subsequent to said first and second precharge circuits for selecting one from outputs of said first and second precharge circuits, wherein the clock signals supplied to said first and second precharge circuits has a period which is an integer multiple of the period of a clock supplied to said latch circuit.

3. A semiconductor integrated circuit device according to claim 1, further comprising:

a third precharge circuit connected at a stage subsequent to said first and second precharge circuits and controlled by a clock signal having a frequency twice the frequency of the clock signals for controlling said first and second precharge circuits.

4. A semiconductor integrated circuit device according to claim 1, further comprising:

a static circuit connected at a stage subsequent to said first and second precharge circuits.

5. A semiconductor integrated circuit device according to claim 1, further comprising:

a fourth precharge circuit connected at a stage previous to said first and second precharge circuits and controlled by a clock signal having a frequency twice the frequency of the clock signals for controlling said first and second precharge circuits.

6. A semiconductor integrated circuit device according to claim 3, further comprising:

a fourth precharge circuit connected at a stage previous to said first and second precharge circuits and controlled by a clock signal having a frequency twice the frequency of the clock signals for controlling said first and second precharge circuits.

7. A semiconductor integrated circuit device according to claim 4, further comprising:

a fourth precharge circuit connected at a stage previous to said first and second precharge circuits and controlled by a clock signal having a frequency twice the frequency of the clock signals for controlling said first and second precharge circuits.

8. A semiconductor integrated circuit according to claim 2, further comprising:

a sub-clock signal generator located near said first and second precharge circuits, wherein said sub-clock signal generator locally generates the clock signals supplied to said first and second precharge circuits.

9. A semiconductor integrated circuit according to claim 2, wherein:

said clock supplied to said latch circuit and the clock signals supplied to said first and second precharge circuits are both generated by a master clock generator provided in said semiconductor integrated circuit device.

10. A semiconductor integrated circuit device comprising:

first precharge means controlled by a first clock signal to precharge a predetermined node therein during a low level period or a high level period of said first clock signal and to operate on an input signal during a high level period or a low level period of said first clock signal; and second precharge means, arranged in parallel with said first precharge means, said second precharge means controlled by an inverted clock signal generated by inverting said first clock signal and having the same operational functions as said first precharge means.

11. A semiconductor integrated circuit device according to claim 10, further comprising:

latch means connected to a stage previous to said first and second precharge means and controlled by a clock signal having a frequency, which is an integer multiple of the frequency of said first clock signal, for latching an input signal; and selector means connected to a stage subsequent to said first and second precharge means for selecting one from outputs of said first and second precharge means.

12. A semiconductor integrated circuit according to claim 10, further comprising:

third precharge means connected at a stage subsequent to said first and second precharge means and controlled by a clock signal having a frequency twice the frequency of said first clock signal for controlling said first and second precharge circuits for alternately operating based on output signals of said first and second precharge means.

13. A semiconductor integrated circuit according to claim 10, further comprising:

static means connected at a stage subsequent to said first and second precharge means for operating in response to changes between output signals of said first and second precharge means.

14. A semiconductor integrated circuit device according to claim 8, further comprising:

fourth precharge means connected at a stage previous to said first and second precharge means and controlled by a clock signal having a frequency twice the frequency of said first clock signal for controlling said first and second precharge means.

15. A semiconductor integrated circuit device according to claim 10, further comprising:

fourth precharge means connected at a stage previous to said first and second precharge means and controlled by a clock signal having a frequency twice the frequency of said first clock signal for controlling said first and second precharge means.

16. A semiconductor integrated circuit device according to claims 11, further comprising:

fourth precharge means connected at a stage previous to said first and second precharge means and controlled by a clock signal having a frequency twice the frequency of said first clock signal for controlling said first and second precharge means.

17. A semiconductor integrated circuit device comprising:

first latch means controlled by a first clock signal having a predetermined period for latching an input signal;

first precharge means controlled by a second clock signal having a period twice the period of said first clock signal, said first precharge means being precharged during one half of the period of said second clock signal and operative based on the signal latched by said latch means during the remaining half period of said second clock signal;

second precharge means controlled by a third clock signal generated by inverting said second clock signal and arranged in parallel with said first precharge means, said second precharge means being operative based on a signal latched by said first latch means during one half of the period of said third clock signal and precharged during the remaining half period of said second clock signal;

selector means controlled by said second clock signal for alternately selecting output signals of said first and second precharge means; and second latch means controlled by said first clock signal for latching an output signal of said selector means.

* * * * *

UNITED STATES PATENT AND TRADEMARK OFFICE
CERTIFICATE OF CORRECTION

PATENT NO. : 5,742,550
DATED : April 21, 1998
INVENTOR(S) : T. YAMAUCHI et al

It is certified that error appears in the above-indentified patent and that said Letters Patent is hereby corrected as shown below:

Column 35, line 3, claim 5, change "fourth" to --third--.

Column 35, line 18, claim 7, change "fourth" to --third--.

Column 36, line 15, claim 14, change "8" to --10--; and
    line 16, change "fourth" to --third--.

Column 36, line 23, claim 15, change "10" to --12--.

Column 36, line 30, claim 16, change "claims 11" to --claim 13--; and
    line 31, change "fourth" to --third--.

Signed and Sealed this

Eighth Day of December, 1998

Attest:

BRUCE LEHMAN

*Attesting Officer*     *Commissioner of Patents and Trademarks*